US010304400B2

(12) United States Patent
Moriyama

(10) Patent No.: US 10,304,400 B2
(45) Date of Patent: May 28, 2019

(54) DISPLAY DEVICE INCLUDING TRANSISTOR ARRANGED WITH CHARACTERISTIC ELECTRODE

(71) Applicant: Japan Display Inc., Tokyo (JP)

(72) Inventor: Naomi Moriyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 2 days.

(21) Appl. No.: 15/460,936

(22) Filed: Mar. 16, 2017

(65) Prior Publication Data

US 2017/0270878 A1    Sep. 21, 2017

(30) Foreign Application Priority Data

Mar. 17, 2016   (JP) ................. 2016-054325

(51) Int. Cl.
G09G 3/36        (2006.01)
H01L 29/786      (2006.01)
G02F 1/1362      (2006.01)
G02F 1/1343      (2006.01)
G02F 1/1368      (2006.01)
(Continued)

(52) U.S. Cl.
CPC ......... *G09G 3/3648* (2013.01); *G02F 1/1368* (2013.01); *G02F 1/13439* (2013.01); *G02F 1/13454* (2013.01); *G02F 1/134336* (2013.01); *G02F 1/136286* (2013.01); *G02F 2201/123* (2013.01); *G09G 2320/0209* (2013.01); *H01L 27/12* (2013.01); *H01L 27/124* (2013.01); *H01L 29/78645* (2013.01)

(58) Field of Classification Search
CPC ............ G09G 3/3648; G09G 3/3674; G02F 1/134336; G02F 1/13439; G02F 1/13454; G02F 1/136209; G02F 1/136286; G02F 1/1368; H01L 27/3262; H01L 27/3244; H01L 27/088; H01L 27/1214; H01L 27/1251; H01L 27/1296; H01L 27/0266; H01L 27/124; H01L 27/1274; H01L 27/14609; H01L 27/14612; H01L 29/78645
See application file for complete search history.

(56) References Cited

U.S. PATENT DOCUMENTS

| 5,982,462 A * | 11/1999 | Nakano | H01L 27/1214 349/43 |
| 2001/0030323 A1* | 10/2001 | Ikeda | H01L 29/78645 257/59 |
| 2006/0022201 A1* | 2/2006 | Kim | G02F 1/1339 257/72 |

FOREIGN PATENT DOCUMENTS

JP    H02-304532 A    12/1990

* cited by examiner

*Primary Examiner* — Xuemei Zheng
(74) *Attorney, Agent, or Firm* — TYPHA IP LLC

(57) ABSTRACT

A display device including a pixel part including a plurality of pixel transistors arranged corresponding to the plurality of pixel electrodes, a scanning signal line arranged on each row and providing a scanning signal to a gate of each of the plurality of pixel transistors belonging to the same row, and a video signal line arranged on each column and providing a video signal to a source or drain of each of the plurality of pixel transistors belonging to the same column, and a drive circuit part including one or more drive transistors and outputting a signal to one of both of the scanning signal line arranged on each row and the video signal line arranged on each column. At least one of the plurality of pixel transistors and the one or more drive transistors is arranged with a characteristic control electrode applying a control voltage.

10 Claims, 34 Drawing Sheets

(51) Int. Cl.
*G02F 1/1345* (2006.01)
*H01L 27/12* (2006.01)

DISPLAY DEVICE INCLUDING TRANSISTOR ARRANGED WITH CHARACTERISTIC ELECTRODE

CROSS REFERENCE TO RELATED APPLICATIONS

This application is based upon and claims the benefit of priority from the prior Japanese Patent Application No. 2016-054325, filed on Mar. 17, 2016, the entire contents of which are incorporated herein by reference.

FIELD

The present invention is related to a display device in which a display pixel (In the present disclosure, it is also simply referred to as a "pixel".) is driven by a circuit including a transistor.

BACKGROUND

Liquid crystal display devices are attracting attention as flat panel displays which achieve lightness and low power consumption. Among them, an active matrix type liquid crystal display device arranged with a switching element such as a thin film transistor in each pixel can obtain a high precision display image with no crosstalk and therefore is being utilized for each type of display beginning with screens for mobile terminals. A semiconductor thin film such as amorphous silicon or polysilicon is used as an active layer of a thin film transistor.

In order to achieve a small scale and narrow frame active matrix type display device, a display device is manufactured in which a drive circuit part for driving each pixel is integrally formed above the same substrate as a pixel part.

An example of an active matrix type liquid crystal display device is disclosed in Japanese Laid Open Patent Publication No. H02-304532. A thin film transistor of a liquid crystal display device in this example includes a dual gate structure in which a gate electrode is arranged both above and below an amorphous silicon layer which forms a channel. An operation pulse signal of a frame cycle is supplied to a first gate electrode located on the lower side, and an inverted pulse voltage is supplied in a frame cycle to a second gate electrode located on the upper side. According to the description in Japanese Laid Open Patent Publication No. H02-304532, by adopting this structure, it is possible to remove the effects of a small voltage variation on a channel upper part of a thin film transistor due to polarity inversion which is essential for liquid crystal display, and thereby it is possible to realize a uniform and high quality display across the entire screen.

SUMMARY

A display device in an embodiment according to the present invention includes a pixel part, the pixel part including a plurality of pixel electrodes arranged in a row direction and column direction, a plurality of pixel transistors arranged corresponding to the plurality of pixel electrodes, a scanning signal line arranged on each row and providing a scanning signal to a gate of each of the plurality of pixel transistors belonging to the same row, and a video signal line arranged on each column and providing a video signal to a source or drain of each of the plurality of pixel transistors belonging to the same column, and a drive circuit part including one or more drive transistors and outputting a signal to one of both of the scanning signal line arranged on each row and the video signal line arranged on each column. Each of the plurality of pixel transistors and the one or more drive transistors arranged above the same substrate and including an active layer and a gate electrode overlapping a part of the active layer via a gate insulation film, and at least one of the plurality of pixel transistors and the one or more drive transistors is arranged with a characteristic control electrode applying a control voltage via an insulation film to a region other than regions overlapping the active layer and the gate electrode.

A display device in an embodiment according to the present invention includes a pixel part, the pixel part including a plurality of pixel electrodes arranged in a row direction and column direction, a plurality of pixel transistors arranged corresponding to the plurality of pixel electrodes, a scanning signal line arranged on each row and providing a scanning signal to a gate of each of the plurality of pixel transistors belonging to the same row, and a video signal line arranged on each column and providing a video signal to a source or drain of each of the plurality of pixel transistors belonging to the same column, and a drive circuit part including one or more drive transistors and outputting a signal to one of both of the scanning signal line arranged on each row and the video signal line arranged on each column. Each of the plurality of pixel transistors include an active layer and a gate electrode intersecting at one section a part of the active layer via a gate electrode film, a rectangle region formed by a part where the gate electrode and the active layer overlap includes a first edge part which is one side electrically formed by one side surface of the gate electrode on the video signal line side, and a second edge part which is one side electrically formed by the other side surface of the gate electrode on the pixel electrode side, and the first edge part is covered by a characteristic control line electrically connected with a corresponding video signal line, and the second edge part is on the same layer as a corresponding video signal line and is covered by a characteristic control line electrically connected with a corresponding pixel electrode.

A display device in an embodiment according to the present invention includes a pixel part, the pixel part including a plurality of pixel electrodes arranged in a row direction and column direction, a plurality of pixel transistors arranged corresponding to the plurality of pixel electrodes, a scanning signal line arranged on each row and providing a scanning signal to a gate of each of the plurality of pixel transistors belonging to the same row, and a video signal line arranged on each column and providing a video signal to a source or drain of each of the plurality of pixel transistors belonging to the same column, and a drive circuit part including one or more drive transistors and outputting a signal to one of both of the scanning signal line arranged on each row and the video signal line arranged on each column. Each of the plurality of pixel transistors include an active layer and a gate electrode intersecting a part of the active layer at two or more sections via a gate electrode film, one rectangle region electrically located on the video signal line side among two rectangle regions formed by a part where the gate electrode and the active layer overlap includes a third edge part which is one side electrically formed by one side surface of the gate electrode on the video signal line side, and a fourth edge part which is one side electrically formed by the other side surface of the gate electrode on the pixel electrode side, the other rectangle region electrically located on the pixel electrode side among the two rectangle regions includes a fifth edge part which is one side electrically formed by one side surface of the gate electrode on the video signal line side, and a sixth edge part which is one side electrically formed by the other side surface of the gate electrode on the pixel electrode side, and each of the third edge part and the fourth edge part is covered by a corresponding video signal line, and each of the fifth edge part and the sixth edge part are on the same layer as a corresponding video signal line and are covered by a characteristic control line electrically connected with a corresponding pixel electrode.

BRIEF DESCRIPTION OF DRAWINGS

FIG. 3 is turned OFF by control of a voltage of a scanning line G;

DESCRIPTION OF EMBODIMENTS

Figure 1:
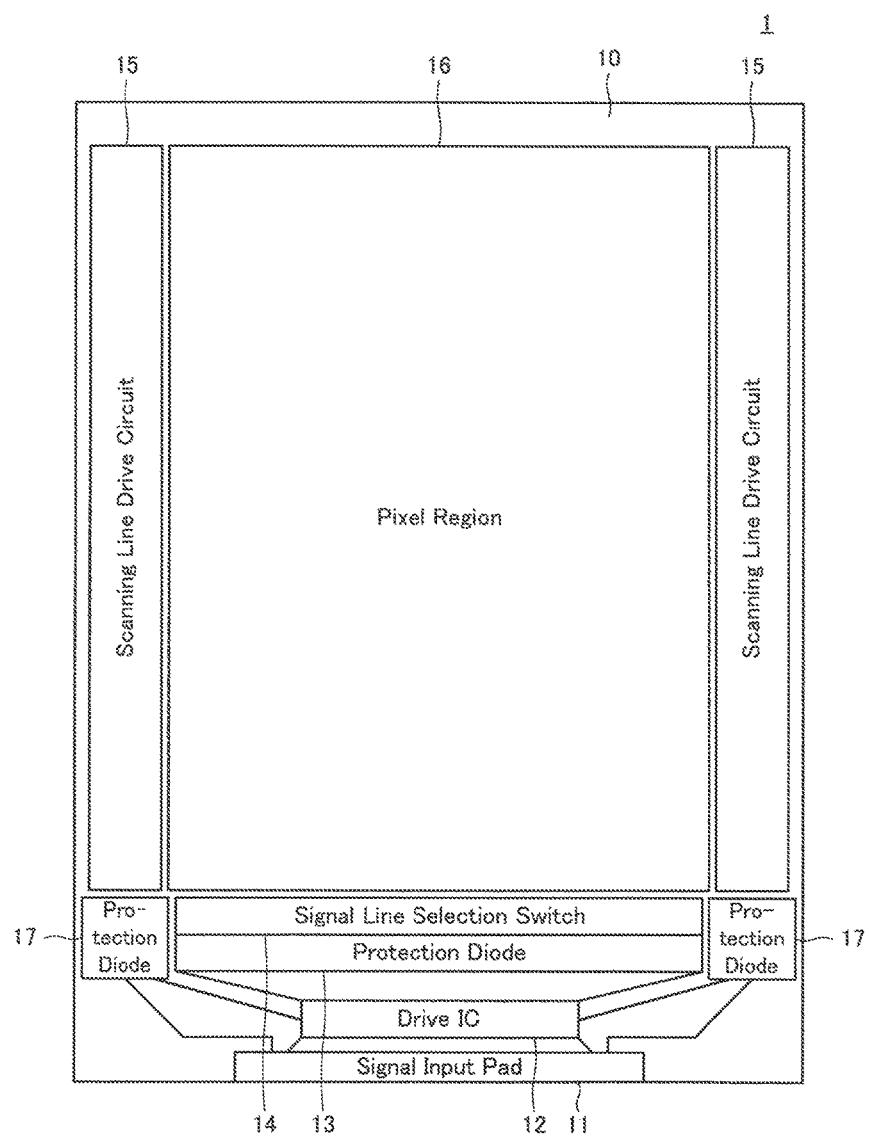
FIG. 1 is a circuit block diagram of a display device related to a first embodiment of the present invention.

In recent years, since the level of resolution required for displays has increased and the pitch of a pixel pattern has become smaller, there is a tendency for a storage capacitor arranged in each pixel for storing a voltage written through a signal line to become relatively small with respect to the storage ability of a thin film transistor which may be a cause of degradation and burning of a pixel. In addition, low power consumption is performed due to a decrease in a signal writing frequency of a display, the length of time that each pixel stores a voltage has increased and storage of a voltage has become even more difficult.

Therefore, a display device which can appropriately hold a charge within a pixel is required even when the pitch of a pixel pattern is small and signal writing frequency is low.

As a method for solving this problem, it is possible to conceive of a method in which the characteristics of a thin film transistor are controlled so that an OFF current of the thin film transistor is reduced. Since the amount of current which flows from each pixel decreases if the OFF current of a thin film transistor is reduced, it is possible to store a charge in advance over a sufficiently long period of time in each pixel even when a storage capacitor of each pixel is small.

With regards to this point, a dual gate structure in Japanese Laid Open Patent Publication No. H02-304532 is considered as one method for controlling the characteristics of a thin film transistor. However, in the technology in Japanese Laid Open Patent Publication No. H02-304532, a voltage applied to a second gate electrode is supplied to a channel part (intersection part between a first gate electrode and an amorphous silicon film) of a thin film transistor, and it is thought that the effect of reducing an OFF current of a thin film transistor can not be sufficiently obtained using this structure.

Here, the problem of reducing an OFF current of a thin film transistor occurs not only with respect to a thin film transistor (pixel transistor) within a pixel but is also common to a thin film transistor (drive transistor) within a drive circuit part for driving a pixel. Therefore, one embodiment of the present invention aims to provide a display device in which an OFF current can be reduced with respect to at least one of a pixel transistor and a drive transistor.

In addition, although the balance between the charging characteristics and storage characteristics of a thin film transistor changes according to the relationship between a voltage supplied to a terminal of a thin film transistor and a threshold value of a thin film transistor, the required optimum characteristics are different between a pixel transistor and a drive transistor, and also between functional blocks within a drive transistor. Although a threshold value becomes the same in the case where a pixel and drive circuit are integrally formed, if the threshold value can be controlled for each individual functional block, it is possible to drive at an operation point close to the optimum. Therefore, another aim of one embodiment of the present invention is to provide a display device in which a threshold value is controlled for each functional block of a pixel and drive circuit.

In addition, reducing a punch-through voltage due to a charge redistribution which occurs when the state of a thin film transistor within a pixel is switched from ON to OFF is effective as a method for improving flickering (difference in luminosity between storage frames) of a pixel. Therefore, another aim of one embodiment of the present invention is to provide a display device in which a punch-through voltage of a pixel can be reduced.

The display device of the present invention is explained in detail below while referring to the diagrams. Furthermore, the display device of the present invention is not limited to the embodiments below and can be performed by implementing various modifications. In all of the embodiments, an explanation is provided by attaching the same reference symbols to the same structural elements. In addition, for the convenience of explanation the dimension ratios in the diagrams may be different from actual ratios and parts of the structure may be omitted from the diagrams.

First Embodiment

FIG. 1 is a circuit block diagram of a display device 1 according to the first embodiment of the present invention. Each circuit block shown in FIG. 1 is integrally formed above a matrix array substrate 10. Although not shown in the diagram, the display device 1 includes a structure in which a horizontal oriented type liquid crystal layer for example is held between the matrix array substrate 10 and a counter substrate via an orientation film comprised of polyimide.

The display device 1 is an active matrix type liquid crystal display device and is formed including a signal input pad 11, drive IC 12, protection diodes 13 and 17, signal line selection switch 14, scanning line drive circuit 15 and pixel region 16 as is shown in FIG. 1. The display region 16 is arranged with a pixel part including a pixel electrode PE, scanning line G and video signal line SL and the like shown in FIG. 2 described herein. In addition, the protection diode 13 and the signal line selection switch 14 are arranged adjacent on the lower side of the pixel region 16 and form a signal line drive circuit which drives a video signal line SL within the pixel region 16. These drive circuits are appropriately formed by a functional block using a shift register, barrier circuit, analog switch and latch circuit and the like.

A logic signal and power supply voltage are supplied to the signal input pad 11 from an upper control device not shown in the diagram. The drive IC 12 is an integrated circuit mounted above a glass substrate and generates a video signal and signal line selection signal based on a logic signal and power supply voltage supplied to the signal input pad 11. The video signal and signal line selection signal generated by the drive IC12 are supplied to the signal line selection switch 14 via the protection diode 13. The signal line selection switch 14 selects one among a plurality of video signal lines SL according to a signal line selection signal and a video signal is supplied to the selected video signal line SL.

The scanning line drive circuit 15 is arranged adjacent on the left and right sides of the pixel region 16, and drives a scanning line G within the pixel region 16 based on a power supply voltage supplied from the signal input pad 11 and protection diode 17 and a logic signal supplied from the drive IC12 via the protection diode 17.

Figure 2:
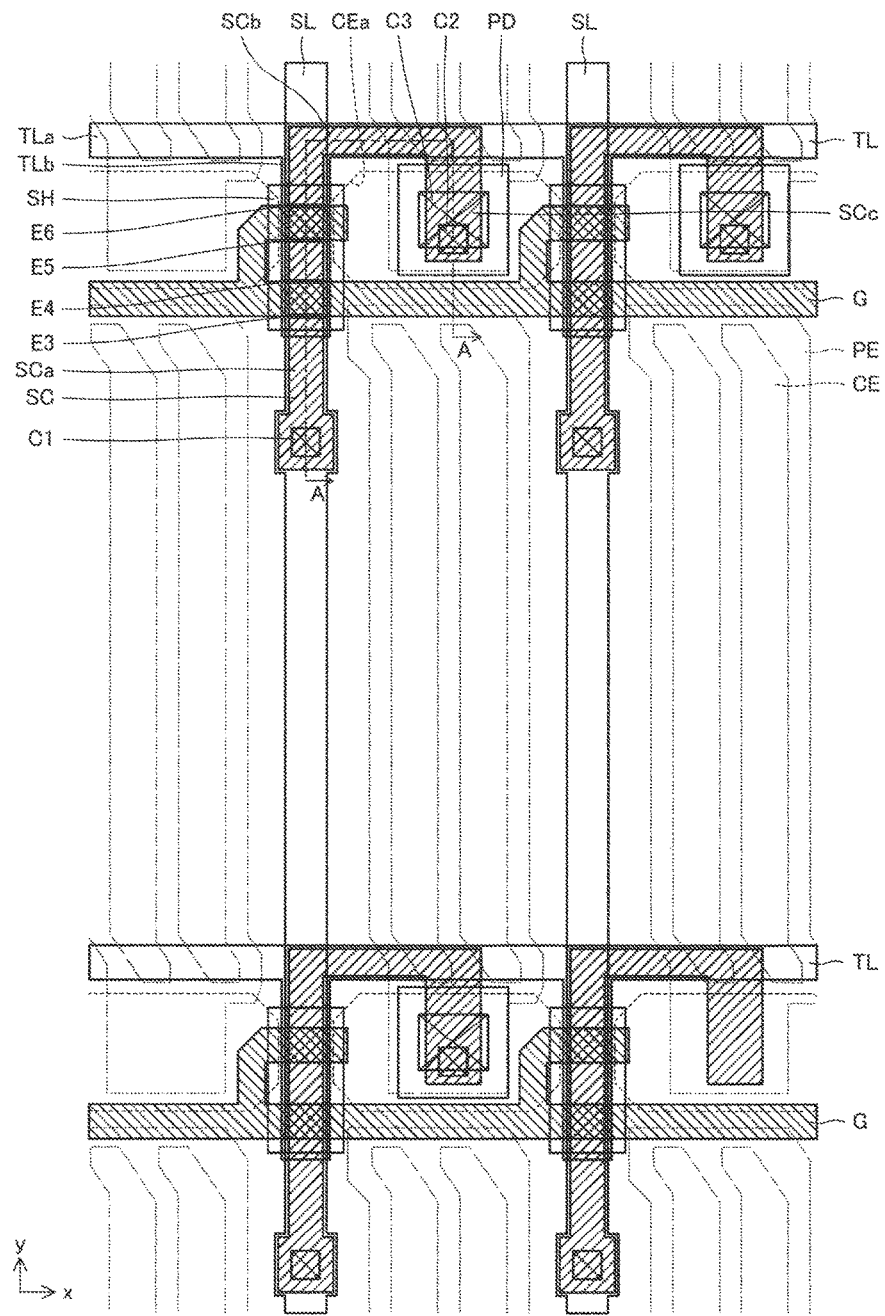
FIG. 2 is a diagram showing in detail a planar structure of one part of a pixel region 16 shown in FIG. 1.
Figure 3:
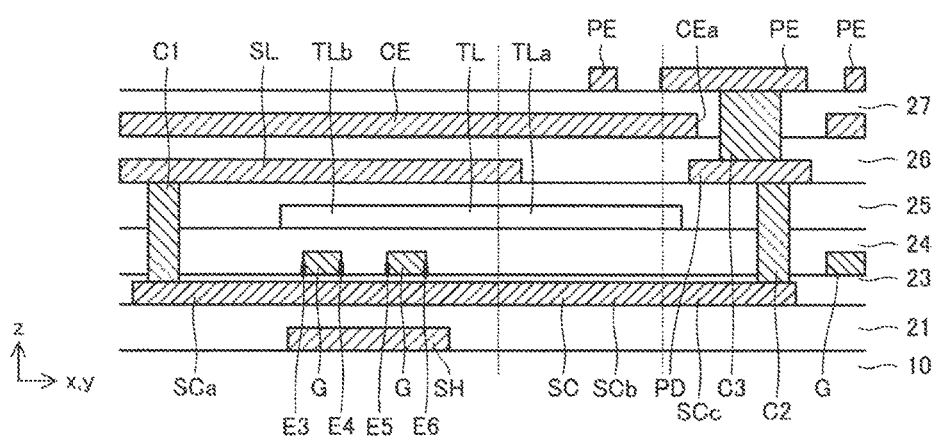
FIG. 3 is a schematic cross-sectional diagram of a display device 1 corresponding to the line A-A shown in FIG. 2.

FIG. 2 is a diagram showing in detail a planar structure of one part of the pixel region 16 shown in FIG. 1. In addition, FIG. 3 is a schematic cross-sectional diagram of the display device 1 corresponding to the line A-A shown in FIG. 2.

First, as is shown in FIG. 2, a plurality of scanning lines G extending in parallel in an x direction in the diagram and a plurality of video signal lines SL extending in parallel in a y direction in the diagram are arranged in the pixel region 16, and a pixel is arranged at each intersection point of these lines. Therefore, each pixel is arranged in a matrix shape. In addition, a plurality of characteristic control lines TL is also arranged in the pixel region 16. The structure of a characteristic control line TL is described in detail herein.

One transistor which becomes the object of characteristic control in the present embodiment is arranged in each pixel. A transistor arranged in each pixel in this way is called a "pixel transistor" herein. As a specific structure, each pixel includes a pixel electrode PE, active layer SC, light blocking layer SH, signal line contact C1, contact base PD and pixel contacts C2, C3 shown in FIG. 2. In addition, a common electrode CE is formed across the entire surface of the pixel region 16, and an opening part CEa is arranged in a position corresponding to each pixel in the common electrode CE.

Furthermore, when a [transistor] is referred to in the present embodiment, an active layer (semiconductor layer formed with a channel region or source region and drain region) is assumed to be a thin film transistor (referred to herein as "TFT") formed by a semiconductor thin film using amorphous silicon or polysilicon.

First, a positional relationship in a vertical direction (normal line direction of the matrix array substrate 10) of each structural element is explained while referring to FIG. 3. As is shown in FIG. 3, a light blocking layer SH and an insulation film 21 are arranged on an upper surface of the matrix array substrate 10. The insulation film 21 is also formed on an upper surface of the light blocking layer SH and covers an upper surface and side surface of the light blocking layer SH. An active layer SC is formed on an upper surface of the insulation film 21. A gate insulation film 23 is formed on an upper surface and side surface of the active layer SC. A scanning line G and insulation film 24 are formed on an upper surface of the gate insulation film 23. The insulation film 24 is also formed on an upper surface of the scanning line G and covers an upper surface and side surface of the scanning line G. A characteristic control line TL and an insulation film 25 are formed on an upper surface of the insulation film 24. The insulation film 25 is also formed on an upper surface of the characteristic control line TL and covers an upper surface and side surface of the characteristic control line TL. A video signal line SL, contact base PD and an insulation film 26 are formed on an upper surface of the insulation film 25. The insulation film 26 is also formed on an upper surface of the video signal line SL and contact base PD and covers an upper surface and side surface of the video signal line SL and contact base PD. A common electrode CE including an opening part CEa is formed on an upper surface of the insulation film 26. An insulation film 27 is formed on an upper surface of the common electrode CE. The insulation film 27 is also buried within the opening part CEa. A pixel electrode PE is formed on an upper surface of the insulation film 27.

Although not shown in the diagram, a backlight light source is arranged on the lower side of the matrix array substrate 10. In addition, an orientation film comprised from polyimide, liquid crystal layer, orientation film, color filter and glass substrate (counter substrate) are arranged on an upper side of a pixel electrode PE in order from the side closest to the pixel electrode PE.

Again, referring to FIG. 2, an active layer CS is a semiconductor layer formed by a polysilicon film including impurities which provide N type or P type conductivity to each region corresponding to a drain and source, and forms each of a channel, drain and source region in a corresponding pixel transistor. Each of a drain and source region among these is arranged on both ends in an extending direction of a wire shaped active layer SC. One end of the active layer SC which forms one of the drain and source is connected to a corresponding video signal line SL via a signal line contact C1 which passes through the gate insulation film 23 and the insulation films 24, 25 as is shown in FIG. 3. The video signal line SL is similarly and respectively connected to a plurality of pixels arranged within in the same column. In addition, the other end of the active layer SC which forms one of the drain and source is connected to the contact base PD via a pixel contact C2 which passes through the gate insulation film 23 and the insulation films 24, 25. The contact base PD passes through the opening part CEa and is connected to the pixel electrode PE via a pixel contact C3 which passes through the insulation films 26, 27, thereby the other end of the active layer SC is connected to the pixel electrode PE.

A gate electrode of a pixel transistor is formed by a scanning line G opposing an active layer SC via the gate insulation film 23 as is shown in FIG. 3. A scanning line G forms a gate electrode common to a plurality of pixel transistors arranged within the same row. Since a scanning line G which is a gate electrode is formed on an upper layer (layer separated from the matrix array substrate 10) of an active layer SC, a pixel transistor according to the present embodiment is a top gate type. A scanning line G is divided in the vicinity of each of a corresponding plurality of active layers SC, and intersects with each active layer SC at two sections. Therefore, a pixel transistor according to the present embodiment serves as a double gate type thin film transistor switch element including two gate electrodes.

When the planar shape of an active layer SC is explained in detail, an active layer SC has a planar shape similar to a [J] character. Specifically, an active layer SC is formed including a first and third part SCa and SCc extending in a y direction respectively, and a second part SCb extending in an x direction. The first part SCa extends in a y direction from one side in a y direction of a scanning line G to the other side through a region directly under a video signal line SL. A signal line contact C1 is connected to one end of the first part SCa, and a scanning line G and a branch line thereof intersect respectively with the first part SCa. In addition, the second part SCb extends in an x direction from the other end of the first part SCa to a center point vicinity of two adjacent video signal lines SL through a region directly under a characteristic control line TL. The third part SCc extends from one end part located at a center point vicinity of two adjacent video signal lines SL among the two ends of the second part SCb, in a y direction up to a ground point which reaches just before a scanning line G. The pixel contact C2 is connected to the other end of the third part SCc.

The light blocking layer SH is a transparent region formed to overlap the entire intersection region between an active layer SC and a scanning line G seen from a normal line direction of the matrix array substrate 10. A light blocking layer SH formed in this way plays a role of preventing light from a backlight light source located on the lower side of the matrix array substrate 10 from affecting the operation of a pixel transistor.

A characteristic control line TL is arranged for each scanning line G and is formed in a layer further above a scanning line G (layer further separated from the matrix array substrate 10) formed in an upper layer (layer separated from the matrix array substrate 10) of an active layer SC as was explained while referring to FIG. 3. In a planar view, a characteristic control line TL is arranged to overlap at least one part of each active layer SC of a pixel transistor which is the object of control when viewed from a normal line direction of the matrix array substrate 10.

More specifically, a characteristic control line TL is formed including a main line TLa extending in parallel with a corresponding scanning line G, and a characteristic control electrode TLb branching off from the main line TLa and extending in a y direction towards a corresponding scanning line G. A characteristic control electrode TLb is arranged for each pixel and extends through a region directly below a corresponding video signal line SL and over a scanning line G. Furthermore, from the view point of suppressing a drop in transmittance, the main line TLa and characteristic control electrode TLb are preferred to be formed by a transparent conductive film such as indium tin oxide ("ITO" herein). In addition, the characteristic control electrode TLb may also be a metal wire utilizing a metal material such as aluminum and molybdenum instead of a transparent conductive film. In this case, it is possible to reduce wire resistance compared to a transparent conductive film such as ITO.

The main line TLa and a part of the characteristic control electrode TLb of a characteristic control line TL oppose an active layer SC sandwiching the gate insulation film 23 and insulation film 24 as is shown in FIG. 3. In this way, an electrostatic capacitor is formed between a characteristic control line TL and an active layer SC. In the display device 1 according to the present embodiment, this electrostatic capacitor is used as a storage capacitor of a pixel.

The main line TLa and characteristic control electrode TLb of the characteristic control line TL are arranged to cover directly above and diagonally above a region towards to the center of an active layer SC as is shown in FIG. 2. More specifically, the main line TLa and characteristic control electrode TLb of the characteristic control line TL are formed to completely cover the entire active layer SC in a width direction at a wider width than the width of a corresponding part of an active layer SC.

Here, parts where a scanning line G and active layer SC overlap are defined as third to sixth edge parts E3~E6 shown in FIG. 2 and FIG. 3. Specifically, a third edge part E3 is defined as one edge formed by one side surface of a scanning line on a signal line contact C1 side (that is, existing electrically on a video signal line SL side), and a fourth edge part E4 is defined as one edge formed by the other side surface of a scanning line G on a pixel contact C2 side (that is, electrically located on a pixel electrode PE side) with respect to one square region located on the signal line contact C1 side (that is, electrically located on a video signal line SL side) among two square regions formed by parts where a scanning line G and active layer SC overlap. In addition, a fifth edge part E5 is defined as one edge formed by one side surface of a (branch line) of a scanning line G on a signal line contact C1 side (that is, electrically located on a video signal line SL side), and a sixth edge part E6 is defined as one edge formed by the other side surface of a (branch line) of a scanning line G on a pixel contact C2 side (that is, electrically located on a pixel electrode PE side) with respect to the other square region located on a pixel contact C2 side (that is, electrically located on a pixel electrode PE side) among the two square regions described above.

It is important that when forming the characteristic control electrode TLb, it is formed to cover the third to sixth edge parts E3~E6. This point is described in detail herein.

Next, the basic operation of the display device 1 is explained. A video signal supplied from a signal line selection switch 14 to a video signal line SL shown in FIG. 3 is supplied to one end of a corresponding active layer SC through a signal line contact C1. Furthermore, a video signal is AC driven for each frame at an amplitude center value of 0V and amplitude of ±4V for example.

In the case where a scanning line G is activated by the scanning line drive circuit 15 shown in FIG. 1, a corresponding pixel transistor turns to an ON state. Therefore, a video signal supplied from a video signal line SL is supplied to a pixel electrode PE through the pixel contacts C1, C2.

A voltage of 0V for example is steadily supplied to a common electrode CE. Therefore, a potential difference between a pixel electrode PE and a common electrode CE changes according to a change of a voltage of a video signal supplied to a pixel electrode PE. When a potential difference between a pixel electrode PE and a common electrode CE changes, transmittance of a liquid crystal layer arranged on an upper layer of a pixel electrode PE changes. The display device 1 realizes arbitrary display by changing this transmittance by changing the voltage of a video signal.

A potential difference between a pixel electrode PE and a common electrode CE is maintained for a while even after a corresponding scanning line G becomes activated. This is realized by keeping the charge in the pixel electrode PE constant due to the holding capacity described above. However, since a charge actually flows out due to an OFF current of a pixel transistor, it is impossible to continuously store a charge infinitely within each pixel even when a storage capacitor is arranged. The display device 1 according to the present embodiment reduces an OFF current of a pixel transistor by applying a voltage to an active layer SC through the characteristic control electrode TLb and as a result, a charge can be stored within each pixel over a sufficiently long period of time.

Specifically, a positive power supply voltage Vgh of +8.5V for example is supplied from the scanning line drive circuit 15 shown in FIG. 1 to the characteristic control electrode TLb. A voltage (referred to herein as [characteristic control voltage]) supplied to the characteristic control electrode TLb in this way is applied through the insulation film 24 shown in FIG. 3 to an active layer SC directly below. In this way, the characteristics of a pixel transistor change and the effect of a reduction in an OFF current is obtained. A specific value of a characteristic control voltage is preferred to be a value (for example 0V or more) above an amplitude center value of a video signal in the case where a pixel transistor which is the object of characteristic control is formed by an N channel type transistor, and is preferred to be a value (for example 0V or less) less than an amplitude center value of a video signal in the case where a pixel transistor which is the object of characteristic control is formed by a P channel type transistor. Furthermore, although a characteristic control voltage may be a DC voltage, a characteristic control voltage may also be a voltage which changes in conjunction with a voltage of a scanning line G. This point is explained in detail herein while referring to FIG. 14.

The effect of a reduction in an OFF current of a pixel transistor in the display device 1 according to the present embodiment is explained below while illustrating experiment results.

Figure 4:
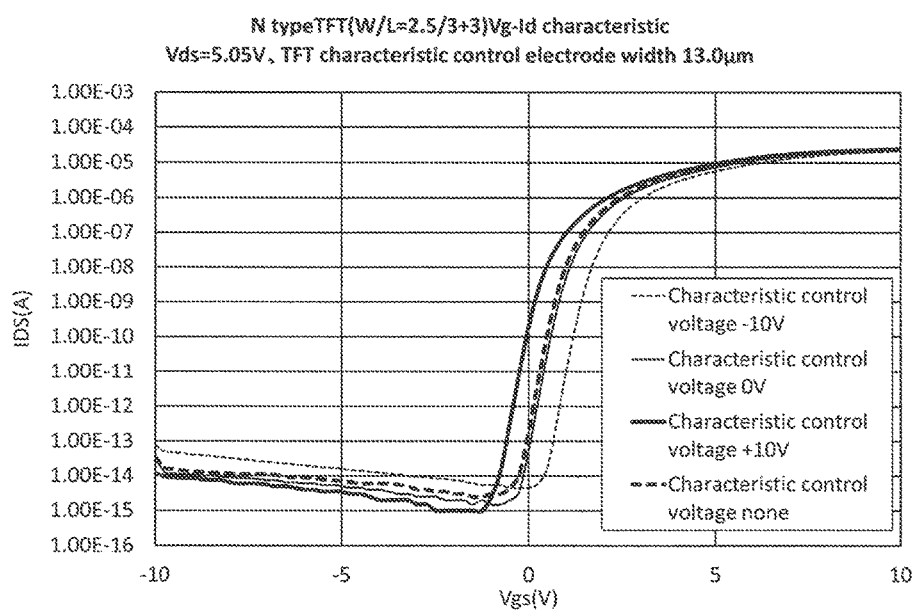
FIG. 4 is a diagram showing VgID characteristics in the case where a characteristic control voltage is changed in a state where a source/drain voltage Vds of 5.05V is applied to an N channel type transistor including the structure shown in FIG. 2 and FIG. 3.

FIG. 4 is a diagram showing a VgId characteristic in the case where a characteristic control voltage is changed in a state where a voltage Vds of 5.05V between a drain/source is applied to an N channel type transistor including the structure shown in FIG. 2 and FIG. 3. However, a W/L ratio (ratio between channel width W and channel length L) of an N channel type transistor was assumed to be 2.5/3+3 and the width of a characteristic control electrode TLb (referred to herein as "characteristic control electrode width") was assumed to be 13.0 µm. In addition, three types of voltage, +10V, 0V and +10V were applied as a characteristic control voltage. Measurement was carried out in a dark state in which light was not incident on the transistor. "No characteristic control voltage" shown in the diagram indicates that a characteristic control electrode is not arranged and is shown for the purpose of comparison.

Figure 5:
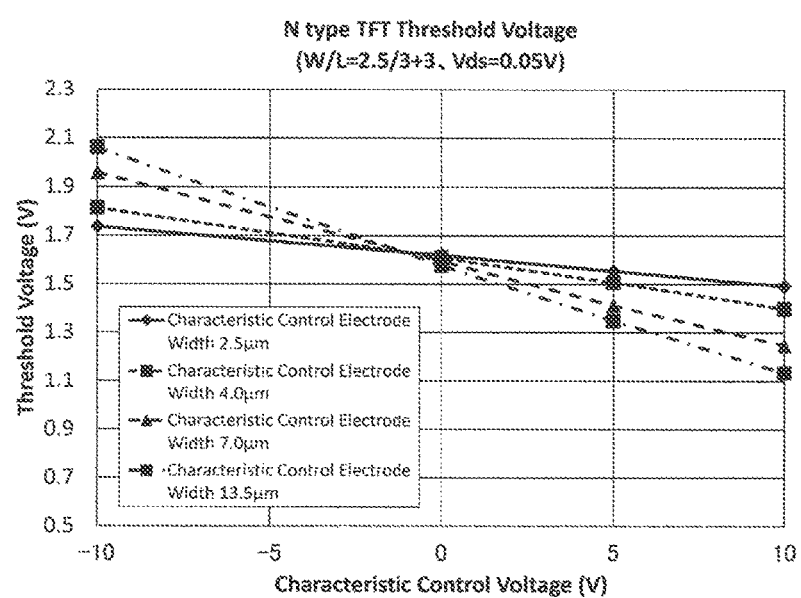
FIG. 5 is a diagram showing a change in a threshold voltage due to a characteristic control voltage with respect to an N channel type transistor including the structure shown in FIG. 2 and FIG. 3.
Figure 6:
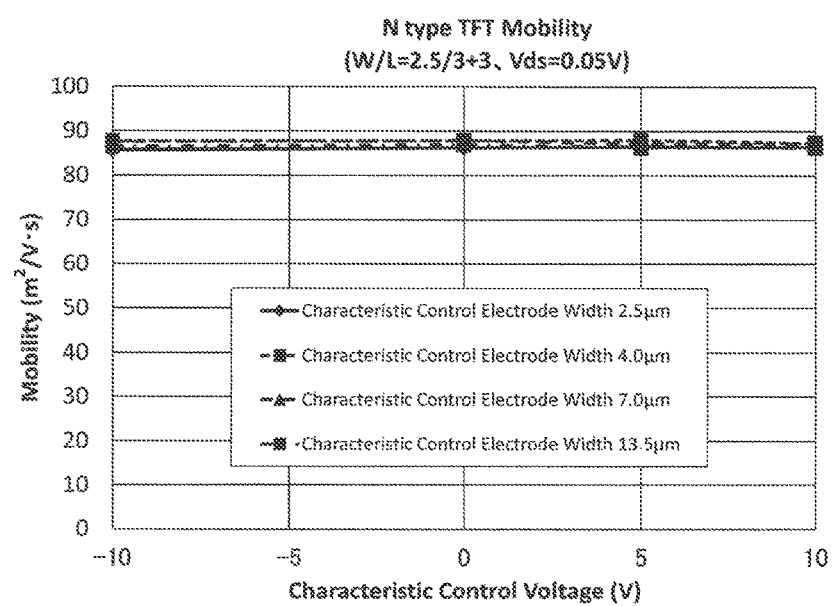
FIG. 6 is a diagram showing a change in field-effect mobility due to a characteristic control voltage with respect to an N channel type transistor including the structure shown in FIG. 2 and FIG. 3.

In addition, FIG. 5 and FIG. 6 are diagrams showing a change in a threshold voltage and field effect mobility due to each characteristic control voltage with respect to an N channel type transistor including the structure shown in FIG. 2 and FIG. 3. In addition, a W/L ratio was 2.5/3+3 and a drain/source voltage Vds was assumed to be 0.05V. Measurement was carried out in a dark state in which light was not incident on the transistor.

A threshold voltage of an N channel type transistor becomes smaller the larger a characteristic control voltage as can be understood from FIG. 5. In addition, a change in a threshold voltage becomes larger the larger the width of a characteristic control electrode. On the other hand, as can be understood from FIG. 4, a smaller drain current IDS are obtained the larger a characteristic control voltage in an OFF region of a pixel transistor. In particular, when a characteristic control voltage is 0V or more, it is possible to obtain a small drain current IDS compared to the case when a characteristic control electrode is not arranged. From this, it can be understood that the effect of a reduction in an OFF current of a pixel transistor can be obtained by applying a plus characteristic control voltage to a characteristic control electrode in the case where the pixel transistor is an N channel type transistor.

In addition, as can be understood from FIG. 6, field effect mobility of an N channel type transistor is not changed by a characteristic control voltage. In addition, field effect mobility is also not changed by a characteristic control electrode width. Therefore, it is possible to say that arranging a characteristic control electrode does not affect the display characteristics of the display device 1.

Figure 7:
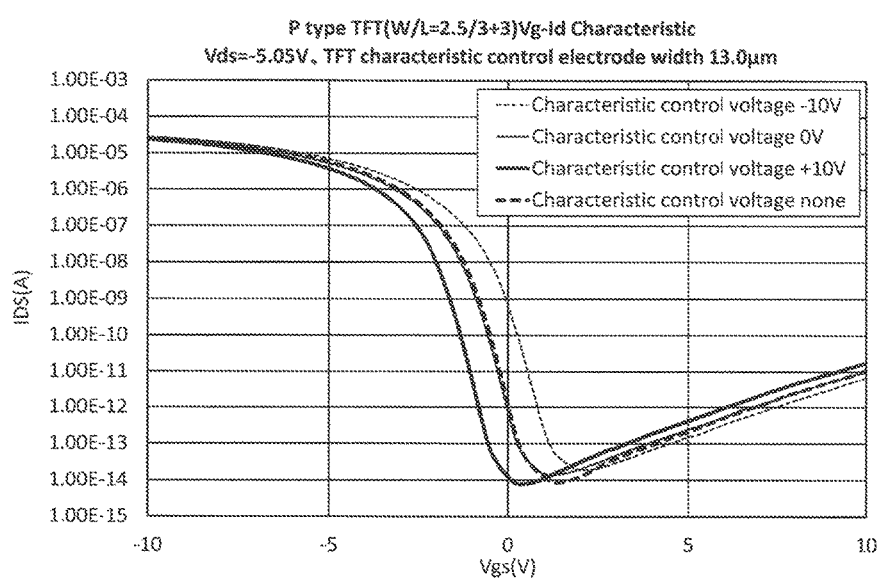
FIG. 7 is a diagram showing VgID characteristics in the case where a characteristic control voltage is changed in a state where a source/drain voltage Vds of −5.05V is applied to a P channel type transistor including the structure shown in FIG. 2 and FIG. 3.

FIG. 7 is a diagram showing a VgId characteristic in the case where a characteristic control voltage is changed in a state where a voltage Vds of −5.05V between a drain/source is applied to a P channel type transistor including the structure shown in FIG. 2 and FIG. 3. However, a W/L ratio was assumed to be 2.5/3+3 and the characteristic control electrode width was assumed to be 13.0 µm the same as the example in FIG. 4. In addition, three types of voltage, +10V, 0V and −10V were applied as a characteristic control voltage. Measurement was carried out in a dark state in which light was not incident on the transistor. The meaning of "No characteristic control voltage" shown in the diagram is the same as the example in FIG. 4.

Figure 8:
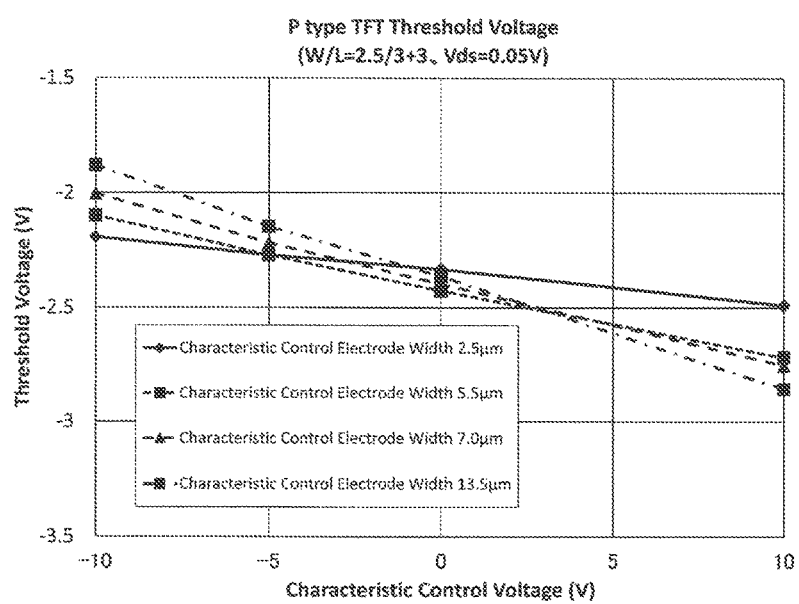
FIG. 8 is a diagram showing a change in a threshold voltage due to a characteristic control voltage with respect to a P channel type transistor including the structure shown in FIG. 2 and FIG. 3.
Figure 9:
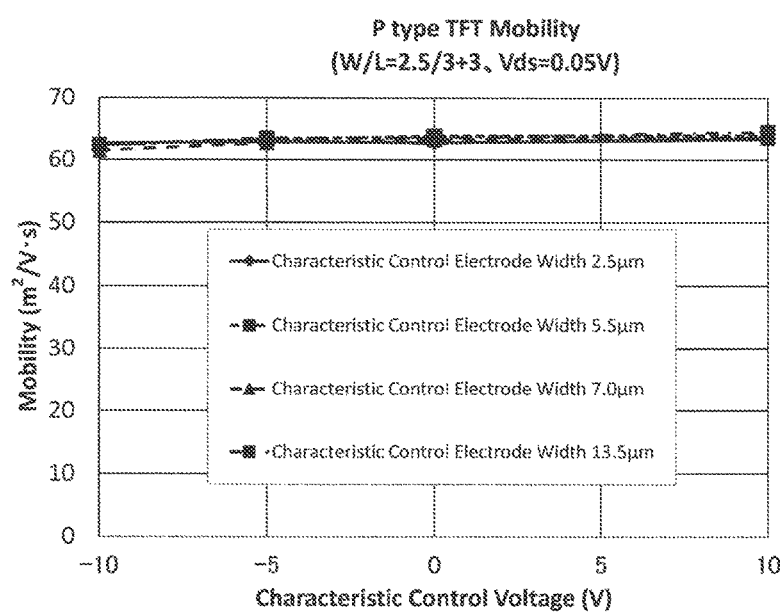
FIG. 9 is a diagram showing a change in field-effect mobility due to a characteristic control voltage with respect to a P channel type transistor including the structure shown in FIG. 2 and FIG. 3.

In addition, FIG. 8 and FIG. 9 are diagrams showing a change in a threshold voltage and field effect mobility due to each characteristic control voltage with respect to a P channel type transistor including the structure shown in FIG. 2 and FIG. 3. In addition, a W/L ratio was 2.5/3+3 and a drain/source voltage Vds was assumed to be 0.05V. Measurement was carried out in a dark state in which light was not incident on the transistor.

A threshold voltage of a P channel type transistor becomes smaller the larger a characteristic control voltage the same as an N channel type transistor as can be understood from FIG. 8. In addition, a change in a threshold voltage becomes larger the larger the width of a characteristic control electrode. In addition, as can be understood from FIG. 7, a smaller drain current IDS are obtained the smaller a characteristic control voltage in an OFF region of a pixel transistor. In particular, when a characteristic control voltage is 0V, it is possible to obtain an equivalent drain current IDS as the case when a characteristic control electrode is not arranged, and when a characteristic control voltage is −10V, it is possible to obtain a small drain current IDS compared to the case when a characteristic control electrode is not arranged. From this, it can be understood that the effect of a reduction in an OFF current of a pixel transistor can be obtained by applying a minus characteristic control voltage to a characteristic control electrode in the case where the pixel transistor is a P channel type transistor.

In addition, as can be understood from FIG. 9, field effect mobility of a P channel type transistor is not changed by a characteristic control voltage. In addition, field effect mobility is also not changed by a characteristic control electrode width. Therefore, it is possible to say that arranging a characteristic control electrode does not affect the display characteristics of the display device 1.

Figure 10A:
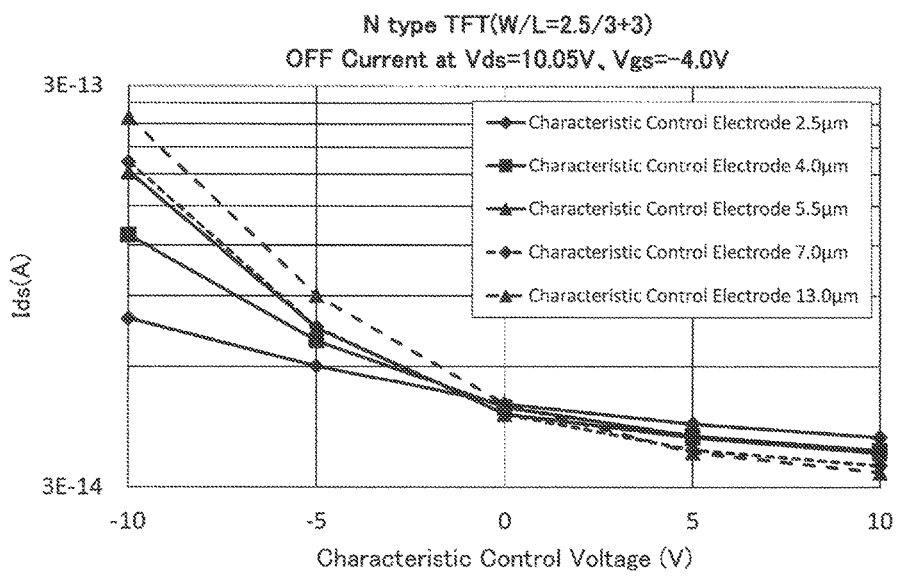
FIG. 10A is a diagram showing characteristic control electrode width dependency of an amount of OFF current of an N channel type transistor in the case where a characteristic control voltage is changed in 5 stages from −10V to +10V.
Figure 10B:
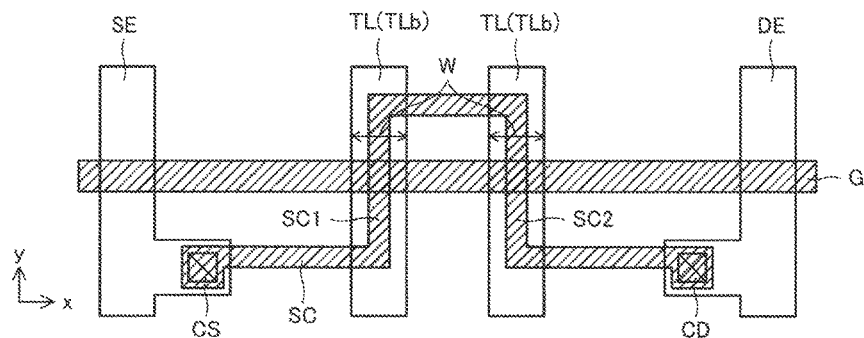
FIG. 10B is a diagram showing a structure of a model used in the measurement in FIG. 10A.

Next, FIG. 10A is a diagram showing characteristic control electrode width dependency of an amount of OFF current of an N channel type transistor in the case where a characteristic control voltage is changed in 5 stages from −10V to +10V. In the experiment in FIG. 10A, a measurement of a drain current IDS was performed using the model shown in FIG. 10B in order to more easily understand the effects of a characteristic control electrode width. When explained in detail, first, in addition to arranging a scanning line G extending in an x direction, a source electrode SE and drain electrode DE extending in a y direction are arranged at both ends in an x direction and an active layer SC is arranged in a region therebetween. The active layer SC has a symmetrical shape with respect to a center line in an x direction, is connected to the source electrode SE via a source contact CS at one end in an x direction, is connected to the drain electrode DE via a drain contact CD at the other end in an x direction, and parts SC1 and SC2 each extending in a y direction are further arranged midway of a part extending in an x direction. In addition, two characteristic control electrodes TLb are arranged each extending in a y direction to completely cover the parts SC1 and SC2. The characteristic control electrode width in this case is the width W in an x direction of each characteristic control electrode TLb. Furthermore, the W/L ratio of the N channel type transistor shown in FIG. 10B was assumed to be 2.5/3+3, a drain/source voltage Vds was 10.05V and a gate voltage Vgs was −4.0V. In addition, five types of width, 2.5 μm, 4.0 μm, 5.5 μm, 7.0 μm and 13.0 μm were used as the width W in an x direction of each characteristic control electrode TLb. Measurement was carried out in a dark state where no light was incident on the transistor.

As can be understood from FIG. 10A, a change in the amount of an OFF current of an N channel type transistor becomes larger the larger the width of a characteristic control electrode width. Therefore, it can be said that the effect of a reduction in an OFF current of a pixel transistor becomes greater the larger the width of a characteristic control electrode width in the case where a characteristic control voltage is a plus voltage.

Figure 11A:
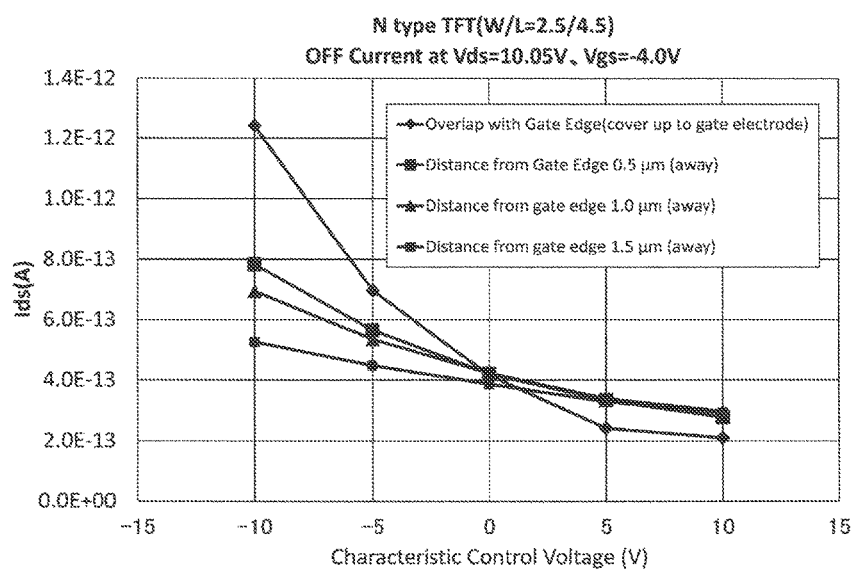
FIG. 11A is a diagram showing dependency with respect to [distance from a gate edge] of an amount of OFF current of an N channel type transistor in the case where a characteristic control voltage is changed in 5 stages from −10V to +10V.

Next, FIG. 11A is a diagram showing dependency with respect to "distance from a gate edge" of an amount of OFF current of an N channel type transistor in the case where a characteristic control voltage is changed in 5 stages from −10V to +10V. This example indicates the importance of forming a characteristic control electrode TLb to cover the third to sixth edge parts E3~E6 shown in FIG. 2 and FIG. 3, and "distance from a gate edge" means the distance from a tip end of a characteristic control electrode TLb to an edge part. However, since the structure shown in FIG. 2 and FIG. 3 is difficult to understand since the structure of an edge part vicinity is a double gate type structure and complex, a measurement of a drain current IDS in the experiment in FIG. 11A was performed using the model shown in FIG. 11B. When explained in detail, first, in addition to arranging a scanning line G extending in an x direction, a source electrode SE and drain electrode DE each extending in a y direction are arranged at both ends in an x direction and an active layer SC was arranged in a region therebetween. The active layer SC is a wire extending in an x direction, is connected to the source electrode SE via a source contact CS at one end in an x direction and is connected to the drain electrode DE via a drain contact CD at the other end in an x direction. A branch line extending in a y direction is arranged in the scanning line G to cover a center point of the active layer SC. Furthermore, two characteristic control electrodes TLb each extending in a y direction are arranged on both sides of the branch line of the scanning line G so that a distance from the branch line becomes mutually equal. In addition, a branch line extending above the active layer SC towards the branch line of the scanning line G is arranged in each of the two characteristic control electrodes TLb. The "distance from a gate edge" in this case is a distance D in an x direction from the tip end of the branch line of each characteristic control electrode TLb to a side surface of the scanning line G. Furthermore, the W/L ratio of the N channel type transistor shown in FIG. 11B was assumed to be 2.5/4.5, a drain/source voltage Vds was 10.05V and a gate voltage Vgs was −4.0V. In addition, four types of distance from a gate edge, a minus value, 0.5 μm, 1.0 μm and 1.5 μm were used as the distance D from a gate edge. The distance D being a minus value means that the branch line of each characteristic control electrode TLb runs up to directly above the branch line of the scanning line G. Measurement was carried out in a dark state where no light was incident on the transistor.

As can be understood from FIG. 11A, while the amount of OFF current of an N channel transistor changes significantly according to the value of a characteristic control voltage when a characteristic control electrode TLb covers the top of a scanning line G, when a gap between the characteristic control electrode TLb and scanning line G is open, the change according to the value of a characteristic control voltage becomes smaller. This means that a characteristic control electrode TLb is preferred to be formed to cover the top of a scanning line G in order to reduce the amount of OFF current of a pixel transistor using a characteristic control voltage. In other words, forming a characteristic control electrode TLb to cover an edge part of a scanning line G is important for reducing an OFF current of a pixel transistor using a characteristic control voltage, and when this is applied to the example in FIG. 2 and FIG. 3, forming a characteristic control electrode TLb to cover the third to sixth edge parts E3~E6 described above is important for reducing an OFF current of a pixel transistor using a characteristic control voltage. However, when the results in FIG. 11A are viewed, there is certainly an effect on the amount of OFF current by an electrical field from a place slightly away from an edge and the effect becomes larger the longer the covering length of a characteristic control electrode.

Figure 11B:
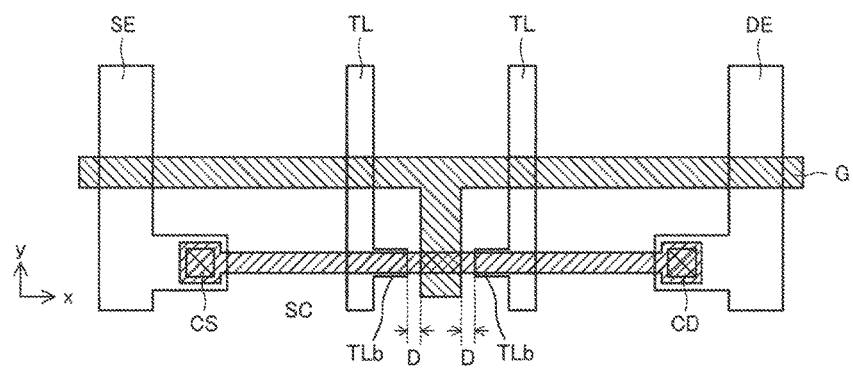
FIG. 11B is a diagram showing a structure of a model used in the measurement in FIG. 10A.
Figure 12A:
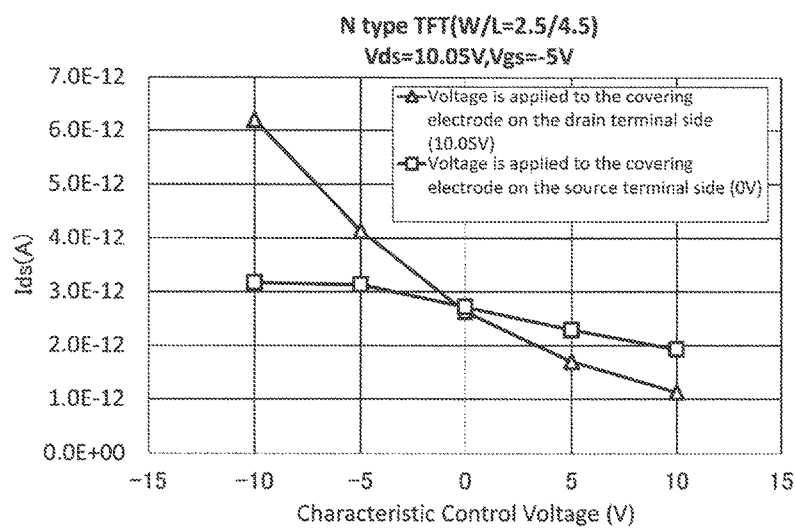
FIG. 12A is a diagram showing a change in an amount of OFF current of an N channel type transistor in the case where a characteristic control electrode TL is divided into a characteristic control electrode TL1 which covers a source side edge part of a scanning line G, and a characteristic control electrode TL2 which covers a drain side edge part of a scanning line G, and a characteristic control voltage is changed in 5 stages from −10V to +10V in a state where the characteristic control voltage is applied to only one of the characteristic control electrodes.
Figure 12B:
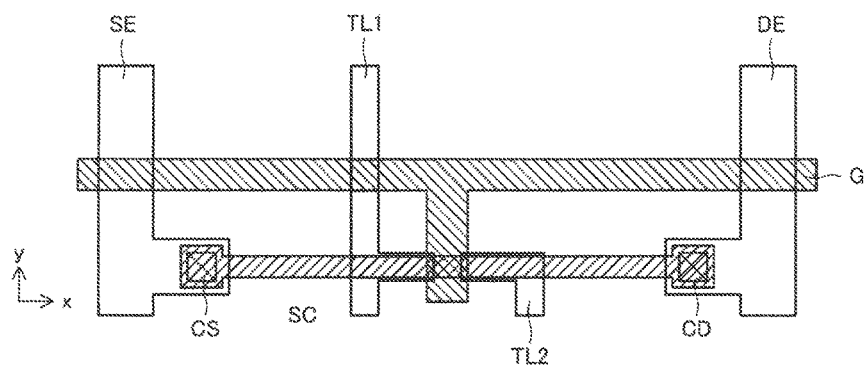
FIG. 12B is a diagram showing a structure of a model used in the measurement in FIG. 12A.

Next, FIG. 12A is a diagram showing a change in an amount of OFF current of an N channel type transistor in the case where a characteristic control electrode TL is divided into a characteristic control electrode TL1 which covers a source side edge part of a scanning line G, and a characteristic control electrode TL2 which covers a drain side edge part of a scanning line G, and a characteristic control voltage is changed in 5 stages from −10V to +10V in a state where the characteristic control voltage is applied to only one of the characteristic control electrodes. Since in this example the structure shown in FIG. 2 and FIG. 3 is also difficult to understand since the structure of an edge part vicinity is a double gate type structure and complex, a measurement of a drain current IDS was instead performed using the model shown in FIG. 12B. Although the structure in FIG. 12B is basically the same as that shown in FIG. 11B, among the two characteristic control electrodes shown in FIG. 11B, the characteristic control electrode which covers an edge part on the source electrode SE side of a scanning line G (characteristic control electrode located on the left side of FIG. 12B) was set as characteristic control electrode TL1, and the characteristic control electrode which covers an edge part on the drain electrode DE side of a scanning line G (characteristic control electrode located on the right side of FIG. 12B) was set as characteristic control electrode TL2. Furthermore, although the characteristic control electrode TL2 is shorter compared to the example in FIG. 11B, this is dependent on the circumstances of the experiment. In addition, a branch line of the characteristic control electrodes TL1 and TL2 both extend up to directly above the branch line of the scanning line G (that is, the distance D shown in FIG. 11B is assumed to be a minus value). The W/L ratio of the N channel type transistor shown in FIG. 12B was assumed to be 2.5/4.5, a voltage applied to the drain electrode DE and source electrode SE were 10.05V and 0V respectively (therefore a drain/source voltage Vds is 10.05V), and a gate voltage Vgs was −5.0V. Measurement was carried out in a dark state where no light was incident on the transistor.

As can be understood from FIG. 12A, the amount of OFF current of an N channel type transistor changes significantly by a characteristic control voltage in the case where a characteristic control voltage is applied to the characteristic control electrode TL2 which covers an edge part on the drain electrode DE side of a scanning line G compared to the case where a characteristic control voltage is applied to the characteristic control electrode TL1 which covers an edge part on the source electrode SE side of a scanning line G. This means that it is possible to obtain a better effect by configuring a characteristic control electrode to cover an edge part on the drain electrode DE side of a scanning line G than an edge part on the source electrode SE side of a scanning line G in order to reduce an OFF current of a pixel transistor by a characteristic control voltage. However, in the case of a pixel transistor it is preferred that all the edge parts are covered since a source and drain are interchanged in each frame cycle.

Figure 13:
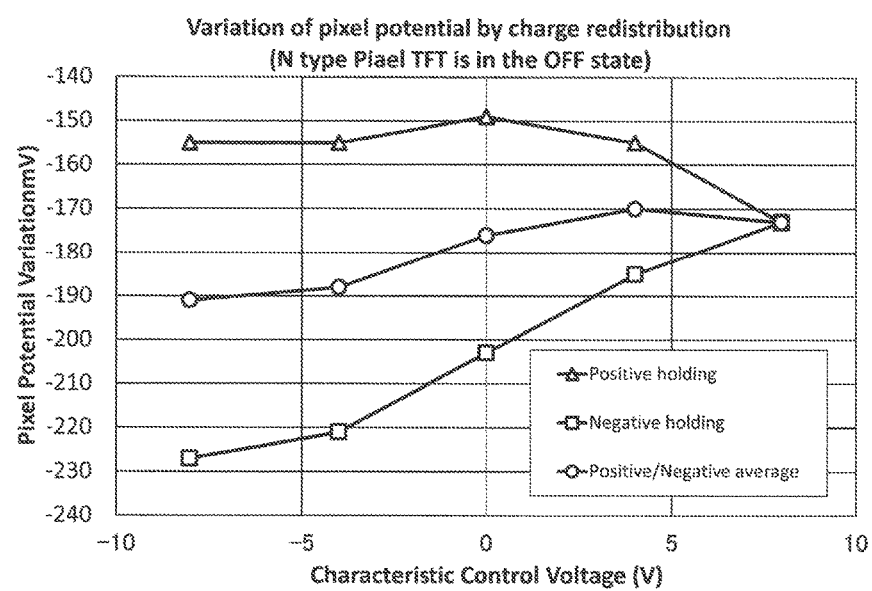
FIG. 13 is a diagram showing the measurement results of a variation amount of a voltage of a pixel electrode PE due to charge redistribution when an N channel type transistor including the structure shown in FIG. 2

Next, FIG. 13 is a diagram showing the measurement results of a variation amount of a voltage of a pixel electrode PE due to charge redistribution when an N channel type transistor including the structure shown in FIG. 2 and FIG. 3 is switched OFF by control of a voltage of a scanning line G. In this example, a W/L ratio was assumed to be 2.5/3+3, a drain/source voltage Vds was 7.28V, and a gate voltage Vgs was −3.36V. In addition, "positive storage" shows a variation value in the case where a plus charge is stored in a pixel electrode PE, "negative storage" shows a variation value in the case where a minus charge is stored in a pixel electrode PE, and "positive negative average" shows an average value of these.

From the results in FIG. 13, it can be said that when the value is "positive negative average", the larger the characteristic control voltage, the smaller the absolute value of a variation change of a pixel voltage due to charge redistribution when a pixel transistor is turned OFF. This means that the larger the characteristic control voltage, the smaller the punch-through voltage described above. Therefore, according to the display device 1, in addition to the reduction effect of an OFF current of a pixel transistor described above, it is possible to obtain a reduction effect of a punch-through voltage by increasing a characteristic control voltage.

As explained above, according to the display device 1 of the present embodiment, since a characteristic control electrode TLb applies a voltage to a part that is not covered by a scanning line G in an active layer SC is arranged in a part which is not covered by a scanning line G in an active layer SC, and a characteristic control voltage is applied to a characteristic control electrode TL for controlling the characteristics of a pixel transistor, it is possible to obtain the effect of a reduction of an absolute value of an OFF current of a pixel transistor. In this way, it is possible to reduce a change in contrast or luminosity. In addition, since a difference in an OFF current between a positive storage frame and a negative storage frame becomes smaller when a fixed voltage is applied by a characteristic control electrode and due to a cut-off effect by a characteristic control electrode of an unnecessary electric field entering an active layer from another electrode, it is possible to reduce flickering and screen burning (phenomenon whereby an image displayed for a long period of time remains when the same image is displayed for a long period of time).

In addition, according to the display device 1 of the present embodiment, it is possible to obtain the effect of reducing a punch-through voltage of a pixel transistor. By reducing an absolute value of a punch-through voltage, it is also possible to reduce in-plane variation of a punch-through voltage which can not be corrected in a voltage value adjustment of a common electrode, thereby it is possible to improve flickering and obtain a liquid crystal device which exhibits better display characteristics.

As is shown in FIG. 5 and FIG. 8, a characteristic control voltage also affects a threshold voltage of a pixel transistor. Since a variation of a threshold voltage affects display characteristics, there are cases where it is desired to obtain the effect of reducing the off current while suppressing the influence on the display characteristics due to the fluctuation of the threshold voltage. Therefore, a method for obtaining a reduction effect of an OFF current while continuing to suppress the effect on display characteristics due to a variation in a threshold voltage is explained below.

Figure 14:
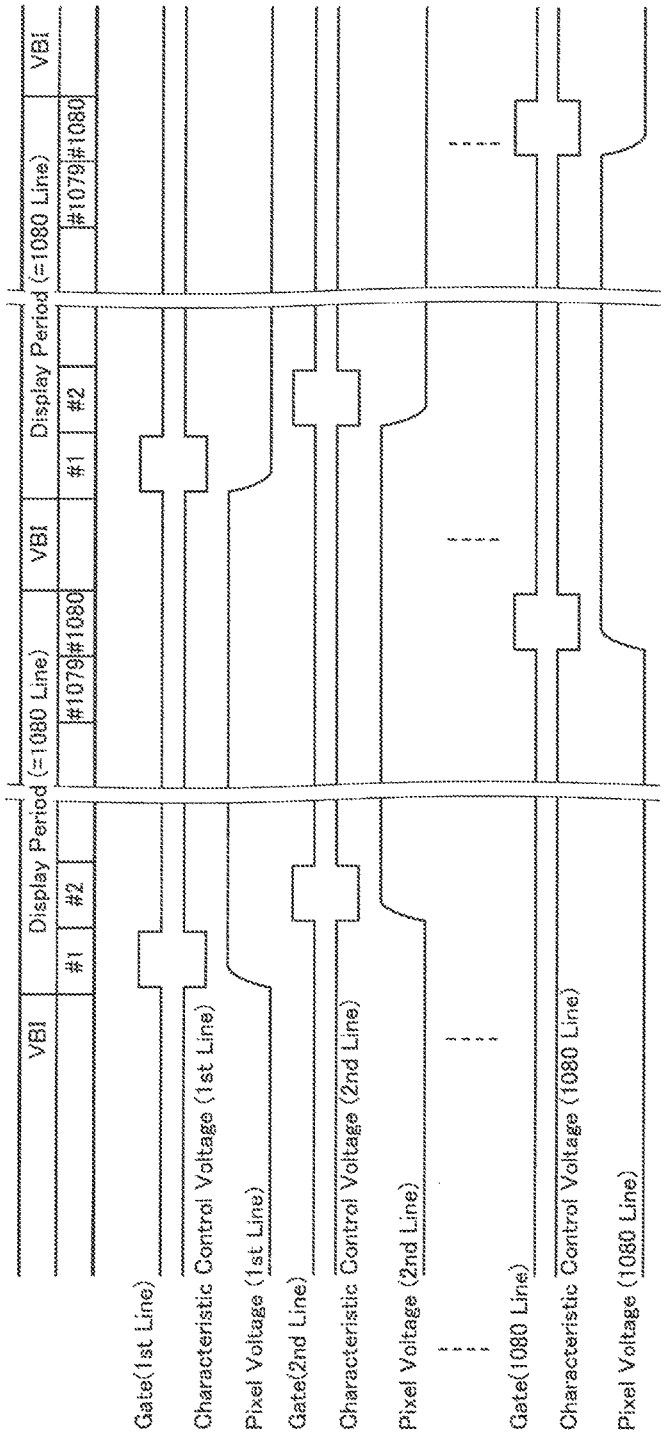
FIG. 14 is a diagram showing an example of voltage control of each scanning line G and each characteristic control electrode TL by the scanning line drive circuit 15 shown in FIG. 1.

FIG. 14 is a diagram showing an example of voltage control of each scanning line G and each characteristic control electrode TLb by the scanning line drive circuit 15 shown in FIG. 1. An example of the display device 1 including 1080 scanning lines G on a first row to 1080th row is shown in the same diagram.

As is shown in FIG. 14, the scanning line drive circuit 15 activates in sequence each scanning line from a first row to 1080th row during a display period. A pixel transistor corresponding to each scanning line G is turned ON when a corresponding scanning line G is activated, and a corresponding pixel electrode PE is connected to a corresponding video signal line SL. In this way, the scanning line drive circuit 15 is configured to repeat the display period in which each scanning line G are sequentially activated in this way, with the vertical blanking period interposed (VBI) therebetween.

The scanning line drive circuit 15 first in principle continues to supply a positive power supply voltage Vgh (+8.5V) as a characteristic control voltage to the characteristic control electrode TLb from a power supply circuit not shown in the diagram. However, the scanning line drive circuit 15 according to the example in FIG. 14 supplies a voltage of 0V as a characteristic control voltage only to the characteristic control electrode TLb corresponding to a scanning line G which is the object of activation when activating a scanning line G. In this way, it is possible to eliminate a variation in a threshold voltage by a characteristic control voltage at a timing when a pixel transistor is turned ON. On the other hand, since a characteristic control voltage of +8.5V is supplied to the characteristic control electrode TLb at a timing when a pixel transistor is turned OFF, it is possible to reduce an OFF current of a pixel transistor. Therefore, according to the example in FIG. 14, it is possible to obtain a reduction effect of an OFF current while continuing to suppress the effects on display characteristics due to a variation in a threshold voltage.

Second Embodiment

Figure 15A:
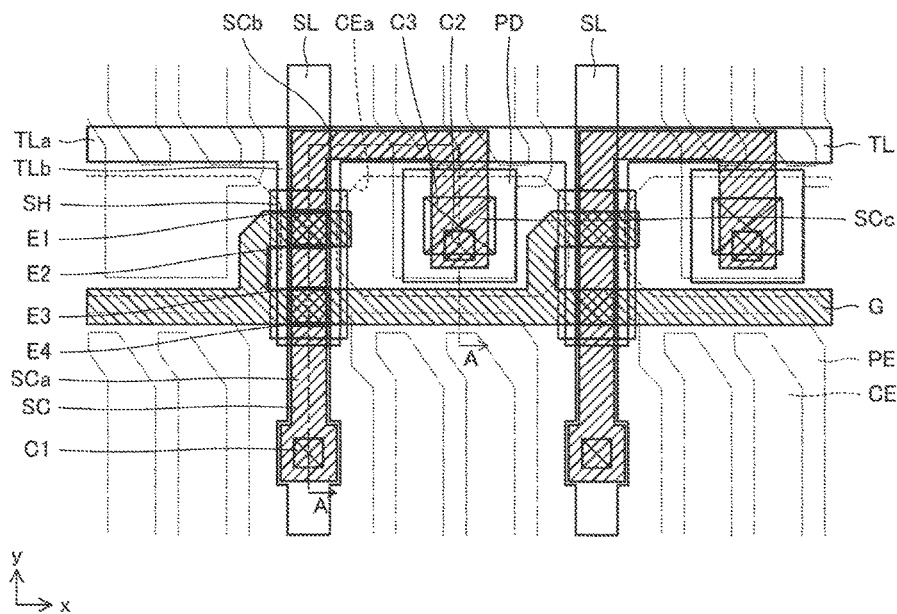
FIG. 15A and FIG. 15B are diagrams each showing in detail a planar structure of mutually different parts of a pixel region 16 of a display device 1 according to a second embodiment of the present invention.
Figure 15B:
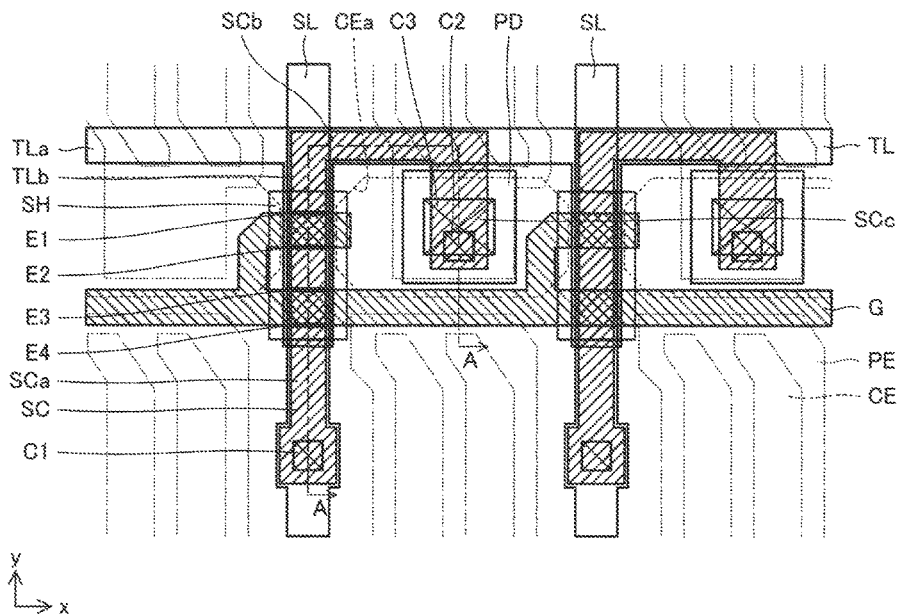

FIG. 15A and FIG. 15B are diagrams each showing in detail a planar structure of mutually different parts of a pixel region 16 of the display device 1 according to a second embodiment of the present invention. The structure of the display device 1 according to the present embodiment is basically the same as that according to the first embodiment but is different to the first embodiment only in that the characteristic control electrode width described above (width of the characteristic control electrode TLb) is different in a row direction (extending direction of a scanning line G). Since the remaining structure is the same as that according to the first embodiment, the same reference symbols are attached to the same structure and the points different from those in the first embodiment are focused on and explained below.

FIG. 15A shows a region relatively close to a power supply end of a scanning line G within the pixel region 16, and FIG. 15B shows a region relatively close to an end of a scanning line within the pixel region 16. As is shown in these diagrams, the width of the characteristic control electrode TLb becomes thicker in a region close to a power supply end of a scanning line G compared to a region close to an end of a scanning line G. Although not shown in the diagrams, it is preferred that the width of the characteristic control electrode TLb is made gradually thicker from a region close to an end of a scanning line G to a region close to a power supply end of a scanning line G.

By designing a characteristic control electrode width in this way, it is possible to make the electric field strongly act on the active layer SC in a region closer to the feeding end of the scanning line G. As can be understood from FIG. 13, since a punch-through voltage of a pixel becomes smaller the stronger an electric field applied to an active layer SC, according to the present embodiment, it is possible to correct a punch-through voltage difference within a display region by a blunt of a signal applied to a scanning line G.

Third Embodiment

Figure 16:
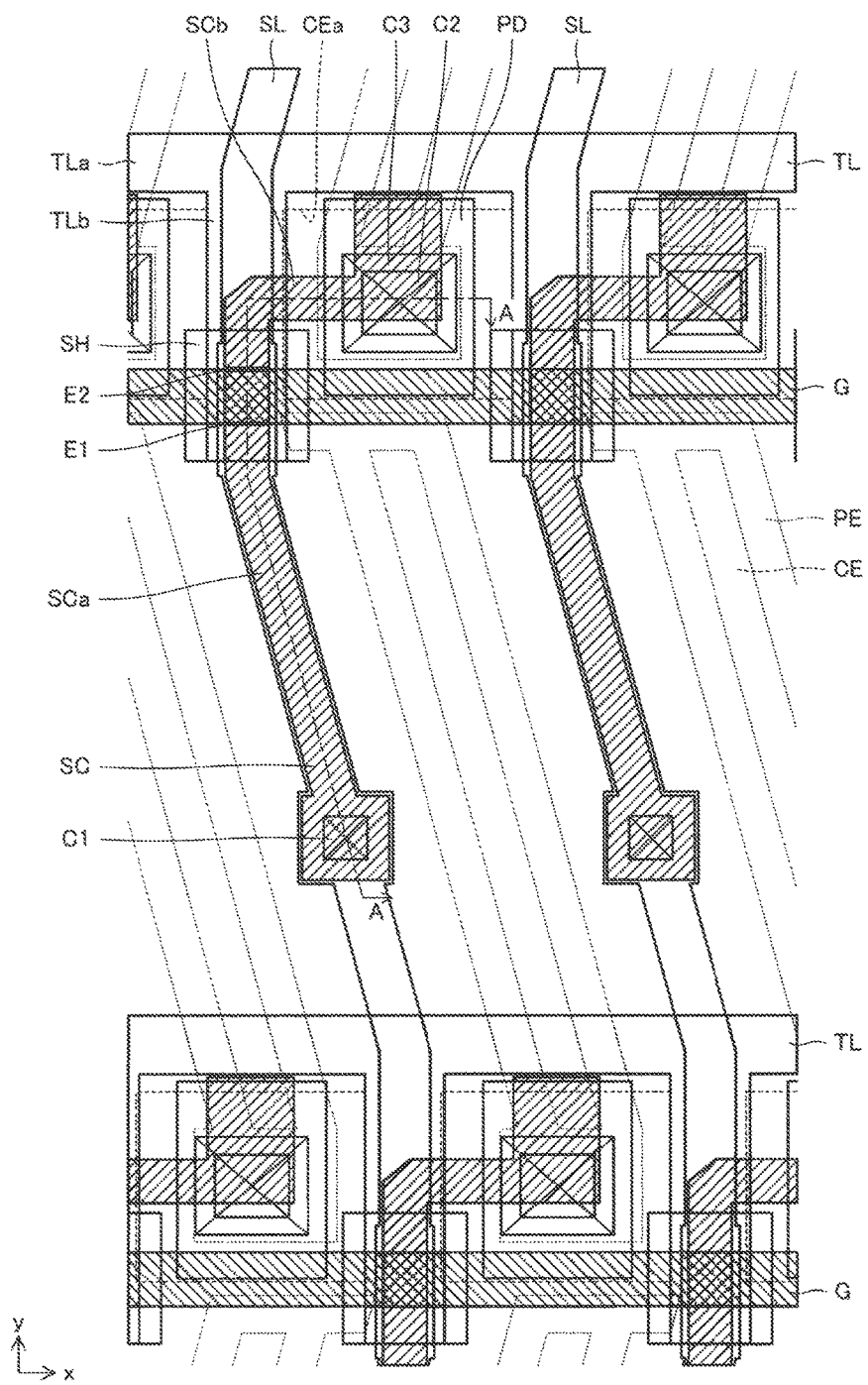
FIG. 16 is a diagram showing in detail a planar structure of a part of a pixel region 16 of a display device 1 according to a third embodiment of the present invention.
Figure 17:
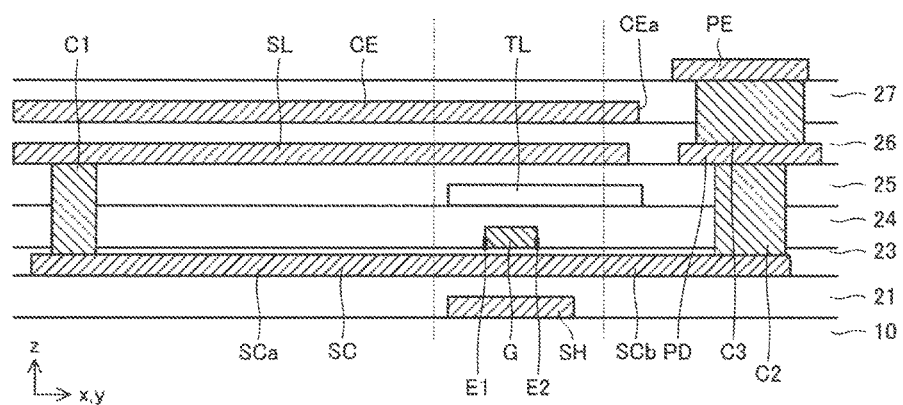
FIG. 17 is a schematic cross-sectional diagram of a display device 1 corresponding to the line A-A shown in FIG. 16.

FIG. 16 is a diagram showing in detail a planar structure of a part of a pixel region 16 of the display device 1 according to a third embodiment of the present invention. In addition, FIG. 17 is a schematic cross-sectional diagram of the display device 1 corresponding to the line A-A shown in FIG. 16. The display device 1 according to the present embodiment is different to the display device 1 according to the first present embodiment in that a scanning line G does not include a branch line, a pixel transistor is a single gate type transistor, an active layer SC does not extend below the main line TLa of a characteristic control line TL and therefore hardly forms a storage capacitor. The same reference symbols are attached to the same structure as the first embodiment and the points different from those in the first embodiment are focused on and explained below.

A video signal line SL according to the present embodiment is formed by a serpentine shaped wire. Specifically, while a video signal line SL extends along a y direction in the vicinity of a scanning line G, it extends along a direction slightly inclined from a y direction in other parts. In addition, this inclination faces in an opposite direction alternately with respect to a pixel aligned in a y direction. Therefore, the extending direction of a video signal SL as a whole is in a y direction the same as in the first embodiment.

A signal line contact C1 according to the present embodiment is arranged in a part extending in a direction slightly inclined from a y direction in a video signal line SL. An active layer SC is formed including a first part SCa extending from this part along a video signal line SL, and a second part SCb extending in an x direction. Among these, a scanning line G intersects with the first part SCa at one section. Therefore, a pixel transistor according to the present embodiment is a single gate type thin film transistor switch element including one gate electrode.

One end of the first part SCa is connected to a video signal line SL via a signal line contact C1. The other end of the first part SCa is located at a section which slightly exceeds a scanning line G seen from the signal line contact C1. The second part SCb extends from the other end of the first part SCa in an x direction to a center point vicinity of two adjacent video signal lines SL. Since the first part SCa does not reach to below the main line TLa of the characteristic control line TL, the second part SCb is not present directly under the characteristic control line TL. Therefore, in the present embodiment a storage capacitor formed in the first embodiment is not formed between the second part SCb and characteristic control line TL. The other end of the second part SCb is connected to a pixel electrode PE via a pixel contact C2 and the like.

The characteristic control electrode TLb is arranged to cover directly below and diagonally above a part (part extending in a y direction) of the first part SCa in an active layer SC as is shown in FIG. 16. More specifically, the characteristic control electrode TLb is formed so as to completely cover the entire active layer SC in a width direction at a wider width than the width of a corresponding part of an active layer SC.

Here, a first edge part and E1 and second edge part E2 shown in FIG. 16 and FIG. 17 are defined as parts where a scanning line G and active layer SC overlap. Specifically, a first edge part E1 is defined as one edge which is formed by one surface side of a scanning line G on a signal line contact C1 side (that is, electrically present on a video signal line SL side), and a second edge part E2 is defined as one edge which is formed by the other surface side of a scanning line G on a pixel contact C2 side (that is, electrically present on a pixel electrode PE side) with respect to a square region formed by a part where the scanning line G and active layer SC overlap.

The characteristic control electrode TLb is preferably formed to cover the first edge part E1 and second edge part E2 described above. The reason for this is as described above referring to FIG. 11A and FIG. 11B.

Even with the display device 1 of the present embodiment, since a characteristic control electrode TLb which applies a voltage is arranged in a part that is not covered by a scanning line G in an active layer SC, by applying a characteristic control voltage to the characteristic control electrode TLb the same as was explained in the first embodiment, it is possible to obtain the effect of a reduction in an OFF current of a pixel transistor. Therefore, since it is possible to hold a charge in advance in each pixel over a sufficiently long period of time even if a storage capacitor of each pixel is small, it is possible to obtain a liquid crystal device which exhibits high display characteristics. Furthermore, the control method of a characteristic control voltage shown in FIG. 14 can also be suitably applied to the present embodiment.

Fourth Embodiment

Figure 18:
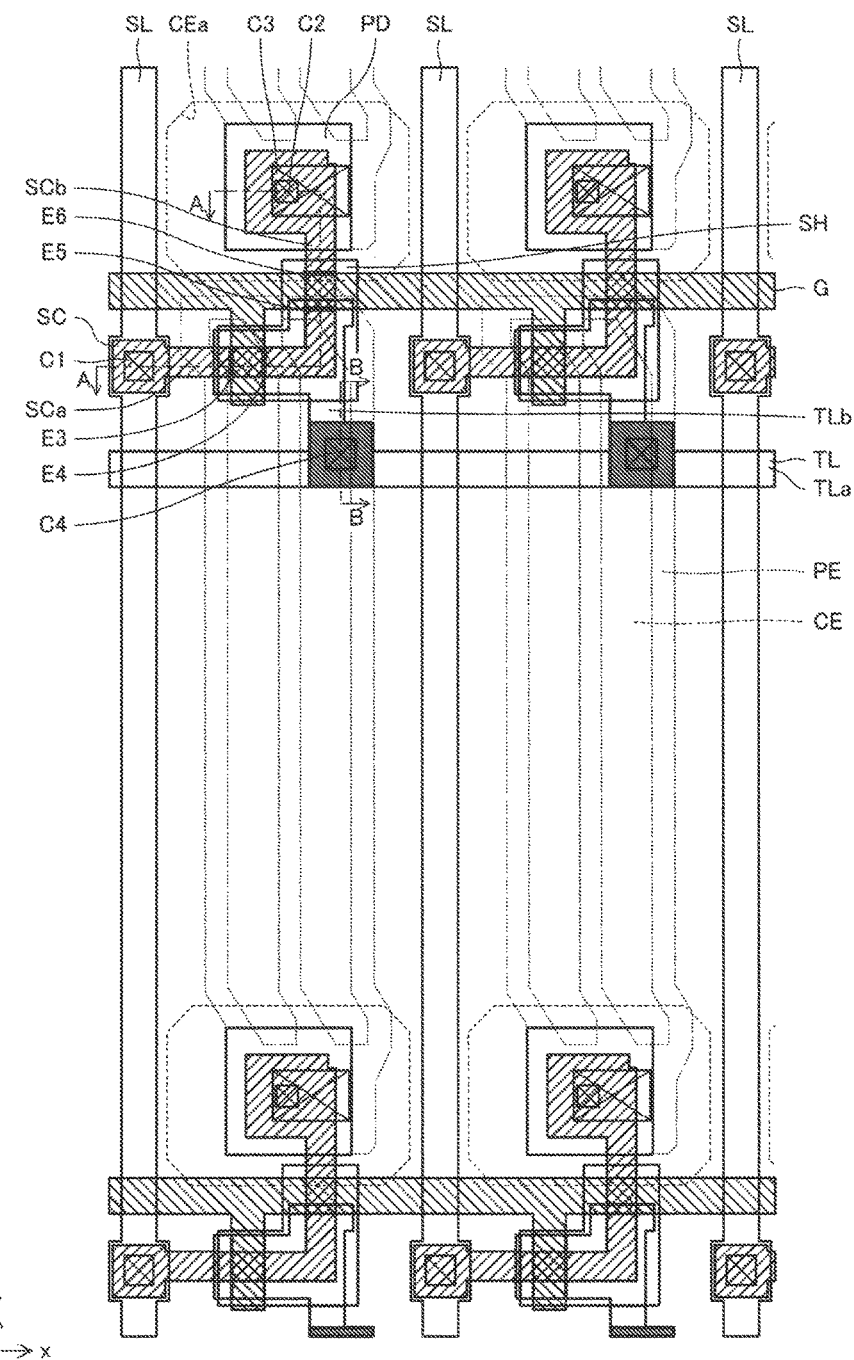
FIG. 18 is a diagram showing in detail a planar structure of a part of a pixel region 16 of a display device 1 according to a fourth embodiment of the present invention.
Figure 19A:
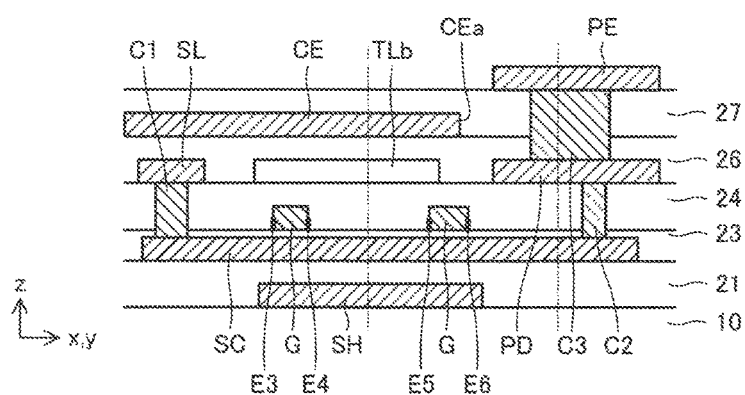
FIG. 19A is a schematic cross-sectional diagram of a display device 1 corresponding to the line A-A shown in FIG. 18.
Figure 19B:
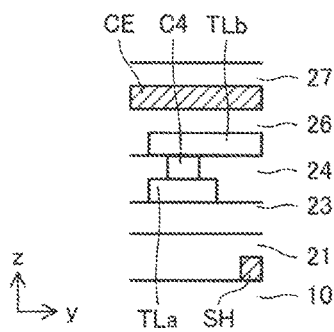
FIG. 19B is a schematic cross-sectional diagram of a display device 1 corresponding to the line B-B shown in FIG. 18.

FIG. 18 is a diagram showing in detail a planar structure of a part of a pixel region 16 of the display device 1 according to a fourth embodiment of the present invention. In addition, FIG. 19A is a schematic cross-sectional diagram of the display device 1 corresponding to the line A-A shown in FIG. 18, and FIG. 19B is a schematic cross-sectional diagram of the display device 1 corresponding to the line B-B shown in FIG. 18. While the display device 1 according to the present embodiment is the same as the display device 1 according to the first embodiment in that a pixel transistor is a double gate type, the display device 1 according to the present embodiment is different to the display device 1 according to the first embodiment in that a main line TLa of the characteristic control line TL (part extending in parallel with a scanning line) is arranged on the same layer as a scanning line G, a pixel contact C2 is arranged on an opposite side of the main line TLa sandwiching a scanning line G, a signal line contact C1 is arranged between a scanning line G and main line TLa, and the shape of a branch line of a scanning line G and the shape of an active layer SC is different. The same reference symbols are attached to the same structure as in the first embodiment and the points different from those in the first embodiment are focused on and explained below.

An active layer SC according to the present embodiment is formed including a first part SCa extending in an x direction and a second part SCb extending in a y direction. One end of the first part SCa is connected to a video signal line SL via a signal line contact C1 in a region between a scanning line G and main line TLa. In addition, the other end of the first part SCa is located at a center point vicinity between two adjacent video signal lines SL. The second part SCb extends from the other end of the first part SCa to a section exceeding a scanning line G. The other end of the second part SCb is connected to a pixel electrode PE via a pixel contact C2 and the like.

A scanning line G is formed including a branch line extending in a y direction for each pixel. The branch line intersects with an active layer SC close to the center of the first part SCa. On the other hand, a main line of a scanning line G intersects with an active layer SC close to the center of the second part SCb. Therefore, a pixel transistor according to the present embodiment is a double gate type.

The main line TLa of the characteristic control line TL is located on the same layer as a scanning line G (that is, above the gate insulation film 23) as is shown in FIG. 19B. On the other hand, the characteristic control electrode TLb of the characteristic control line TL is located on the same layer as a video signal line SL (that is, above the insulation film 24). The main line TLa and characteristic control electrode TLb are connected by a contact C4 which passes through the insulation film 24. The contact C4 is arranged roughly at the same position as an intersection position between a main line of a scanning line G and an active layer SC seen in an x direction, in the upper surface of the main line TLa extending in an x direction. Furthermore, a light blocking layer SH is formed to overlap an entire intersection region between an active layer SC and scanning line G seen from a normal direction of the matrix array substrate 10. In this way, the light blocking layer SH plays the role of preventing light from a backlight light source located on the lower side of the matrix array substrate 10 affecting the operation of a pixel transistor.

The characteristic control electrode TLb is formed including a part extending in a y direction from the contact C4, and a part which branches off from a center point thereof in an x direction. The former is formed to cover a fifth edge part E5 defined in the first embodiment. On the other hand, the latter is formed to cover a third edge part E3 and fourth edge part E4 defined in the first embodiment. In the present embodiment, a sixth edge part E6 is not covered by the characteristic control electrode TLb.

Even with the display device 1 of the present embodiment, since the characteristic control electrode TLb which applies a voltage is arranged in part which is not covered by a scanning line G in an active layer SC, it is possible to obtain the effect of a reduction in an OFF current of a pixel transistor by applying a characteristic control voltage to the characteristic control electrode TLb the same as was explained in the first embodiment. Therefore, since it is possible to store a charge in advance in each pixel over a sufficiently long period of time even when a storage capacitor in each pixel is small, it is possible to obtain a liquid crystal display device which exhibits high display characteristics. In addition, since the characteristic control electrode TLb is formed using the same layer as a scanning line G and video signal line SL, it is not necessary to add a manufacturing process for forming a characteristic control electrode TLb.

Furthermore, in the present embodiment the sixth edge part E6 is not covered by the characteristic control electrode TLb as described above. This is due to the limitation of installation space and although the reduction effect of an OFF current of a pixel transistor is smaller compared to the case where the sixth edge part E6 is covered by the characteristic control electrode TLb, it is possible to obtain a reduction effect of an OFF current of a pixel transistor compared to a case where the characteristic control electrode TLb is not arranged at all. In addition, the control method of a characteristic control voltage shown in FIG. 14 can also be favorably applied to the present embodiment.

Fifth Embodiment

Figure 20:
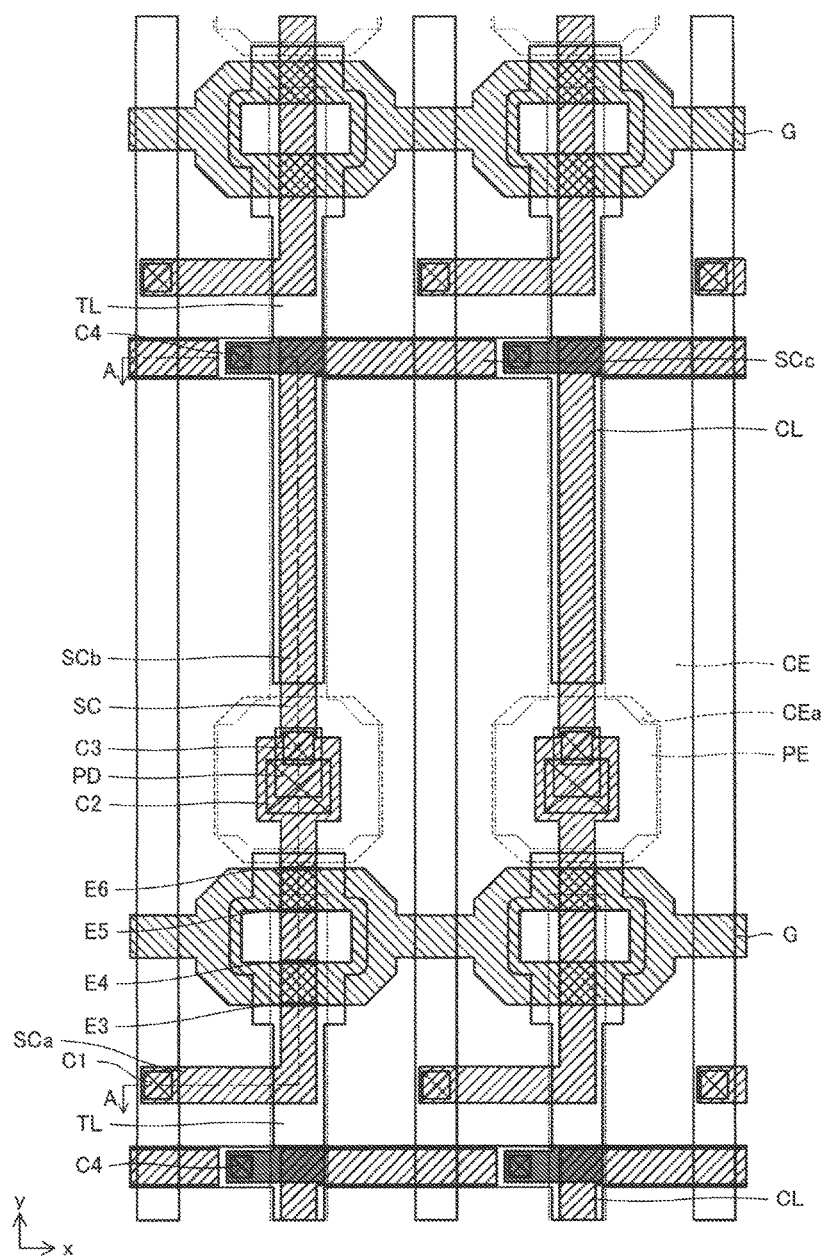
FIG. 20 is a diagram showing in detail a planar structure of a part of a pixel region 16 of a display device 1 according to a fifth embodiment of the present invention.
Figure 21:
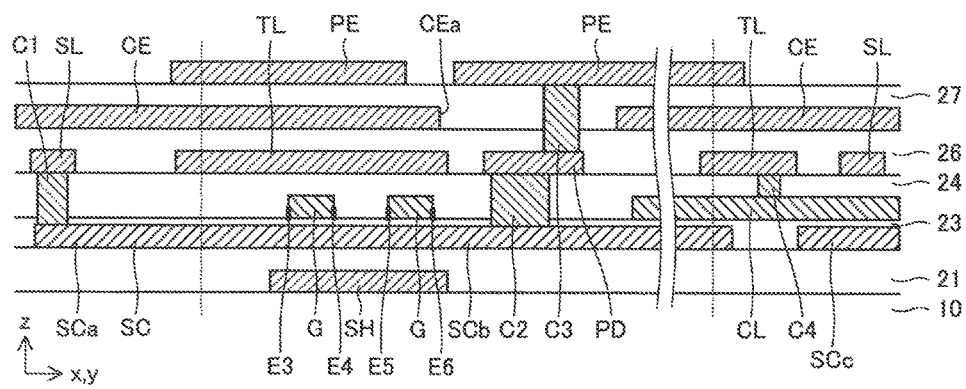
FIG. 21 is a schematic cross-sectional diagram of a display device 1 corresponding to the line A-A shown in FIG. 20.

FIG. 20 is a diagram showing in detail a planar structure of a part of a pixel region 16 of the display device 1 according to a fifth embodiment of the present invention. In addition, FIG. 21 is a schematic cross-sectional diagram of the display device 1 corresponding to the line A-A shown in FIG. 20. While the display device 1 according to the present embodiment is the same as the display device 1 according to the first embodiment in that a pixel transistor is a double gate type, the display device 1 according to the present embodiment is different to the display device 1 according to the first embodiment in that an auxiliary capacitor line CL is included, an active layer SC exceeds a range linking a signal line contact C1 and pixel contact C2 and extends directly below the auxiliary capacitor line CL, an auxiliary capacitor line CL also serves as a main line TLa of a characteristic control line TL, and a scanning line G extends separated into two routes for each pixel. The same reference symbols are attached to the same structure as in the first embodiment and the points different from those in the first embodiment are focused on and explained below.

An active layer SC according to the present embodiment is formed including a first and third part SCa, SCc each extending in an x direction, and a second part SCb extending in a y direction. One end of the first part SCa is connected to a video signal line SL via a signal line contact C1. The other end of the first part SCa is located at a center point vicinity between two adjacent video signal lines SL. The second part SCb extends from the other end of the first part SCa exceeding a scanning line G. In addition, the second part SCb is connected to a pixel electrode PE via a pixel contact C2 at a center point vicinity. The other end of the second part SCb is located in the vicinity of the second part SCa of another active layer SC adjacent in a y direction. The third part SCc extends from the other end of the second part SCb exceeding an adjacent video signal line SL. The other end of the third part SCc is not connected to other wiring.

A scanning line G is arranged separated into two routes for each pixel. A part where the two routes separate includes a symmetrical elliptical shape with respect to a center line in a y direction. An active layer SC intersects with each of the two routes respectively. Therefore, a pixel transistor according to the present embodiment is a double gate type.

An auxiliary capacitor line CL is formed by a part extending above a third part SCc in an x direction of a series of active layers SC arranged in an x direction, and a part extending from this part up to before a pixel contact C2 for each pixel. The auxiliary capacitor line CL is located on the same layer as a scanning line G (that is, above the gate insulation film 23), and opposes a part of an active layer SC (all of the third part SCc and a part of the second part SCb) with the gate insulation film 23 interposed therebetween as is shown in FIG. 21. In this way, an electrostatic capacitor is formed between the auxiliary capacitor line CL and active layer SC. In the display device 1 according to the present embodiment, this electrostatic capacitor is utilized as a storage capacitor of a pixel. A positive power supply voltage Vgh of +8.5V for example is supplied from the scanning line drive circuit 15 shown in FIG. 1 to the auxiliary capacitor line CL.

A characteristic control electrode TL is connected with an auxiliary capacitor line CL by a contact C4 in a region between the third part SCc of active layers SC adjacent in an x direction. Therefore, a positive power supply voltage Vgh of +8.5V for example is also supplied from the scanning line drive circuit 15 to the characteristic control electrode TL. The characteristic control electrode TL extends in an x direction from a connection point with the contact C4 up to a center point between two adjacent video signal lines SL, and from there extends in a y direction up to a position exceeding a scanning line G. The facing direction extending in a y direction in this case is the reverse of an auxiliary capacitor line CL extending in a y direction from the same position.

A part of the characteristic control electrode TL extending in a y direction is formed at a width so that it is possible to completely cover each of the third to sixth edge parts E3-E6 defined in the first embodiment. In addition, in the present embodiment, in particular, the width of a characteristic control electrode TL in a part which intersects with a scanning line G is formed wider than other parts so that it is possible to completely cover a roughly square opening part demarcated on the inner side of an elliptical shaped part formed by a scanning line G separated into two routes.

Even with the display device 1 of the present embodiment, since the characteristic control electrode TLb which applies a voltage is arranged in a part which is not covered by a scanning line G in an active layer SC, it is possible to obtain the effect of a reduction in an OFF current of a pixel transistor by applying a characteristic control voltage to the characteristic control electrode TL the same as was explained in the first embodiment. Therefore, since it is possible to store a charge in advance in each pixel over a sufficiently long period of time even when a storage capacitor in each pixel is small, it is possible to obtain a liquid crystal display device which exhibits high display characteristics.

In addition, since the auxiliary capacitor line CL is arranged in the same layer as a scanning line G, it is possible to obtain a large storage capacitor compared to the case where a storage capacitor is formed by a characteristic control electrode TL arranged on an upper surface of the insulation film 24 as in the first embodiment for example. In addition, since a characteristic control electrode TL is formed using the same layer as a scanning line G and a video signal line SL, it is not necessary to add a manufacturing process for forming a characteristic control electrode TLb.

Furthermore, since the width of a characteristic control electrode TLb in a part intersecting a scanning line G is widened and an opening part formed by a scanning line G separated into two routes is completely covered by a characteristic control electrode TLb, in addition to being able to prevent an electrical field generated by a common electrode CE reaching an active layer SC, it is also possible to increase the reduction effect of an OFF current of a pixel transistor since it is possible to strengthen an electrical field applied in a upper diagonal direction towards an active layer SC.

Sixth Embodiment

Figure 22:
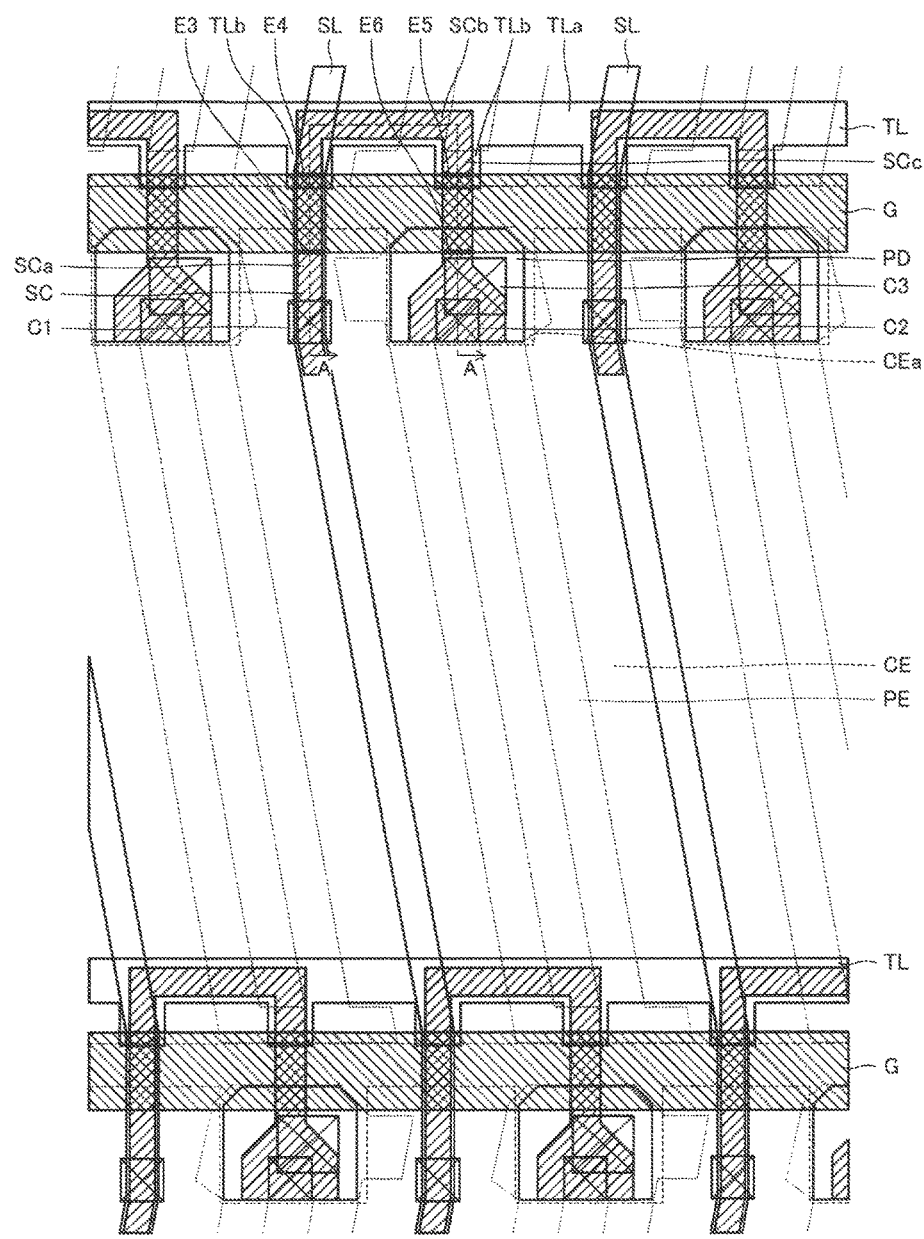
FIG. 22 is a diagram showing in detail a planar structure of a part of a pixel region 16 of a display device 1 according to a sixth embodiment of the present invention.
Figure 23:
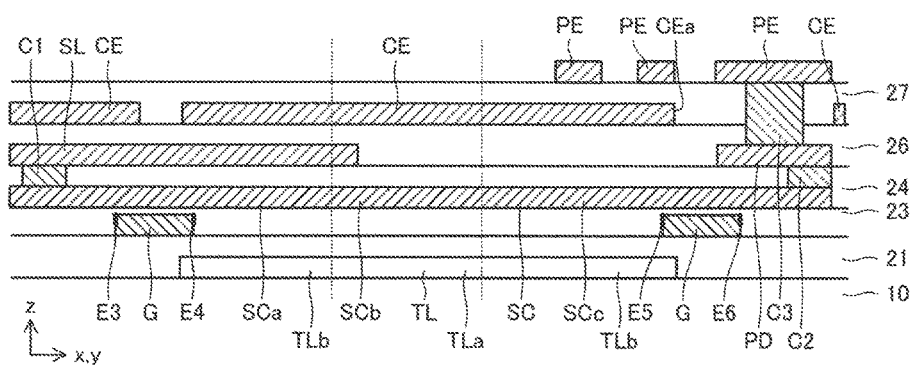
FIG. 23 is a schematic cross-sectional diagram of a display device 1 corresponding to the line A-A shown in FIG. 22.

FIG. 22 is a diagram showing in detail a planar structure of a part of a pixel region 16 of the display device 1 according to a sixth embodiment of the present invention. In addition, FIG. 23 is a schematic cross-sectional diagram of the display device 1 corresponding to the line A-A shown in FIG. 22. While the display device 1 according to the present embodiment is the same as the display device 1 according to the first embodiment in that a pixel transistor is a double gate type, the display device 1 according to the present embodiment is different to the display device 1 according to the first embodiment in that a pixel transistor is bottom gate type including a scanning line G which is a gate electrode on a lower layer (layer close to the matrix array substrate 10) of an active layer SC, a characteristic control line TL is on a lower layer (layer even closer to the matrix array substrate 10) of a scanning line G, and an active layer SC intersects a main line of a scanning line G at two sections. The same reference symbols are attached to the same structure as in the first embodiment and the points different from those in the first embodiment are focused on and explained below.

In the present embodiment, a characteristic control line TL and an insulation film 21 are arranged on an upper surface of the matrix array substrate 10 as is shown in FIG. 23. The insulation film 21 is also formed on an upper surface of the characteristic control line TL and covers an upper surface and side surface of the characteristic control line TL. A scanning line G is formed on an upper surface of the insulation film 21. A gate insulation film 23 is formed on an upper surface of the scanning line G. An active layer SC and an insulation film 24 are formed on an upper surface of the gate insulation film 23. The insulation film 24 is also formed on an upper surface of the active layer SC and covers an upper surface and side surface of the active layer SC. A video signal line SL, contact base PD and an insulation film 26 are formed on an upper surface of the insulation film 24. In this way, the upper side structure is that same as in the first embodiment.

An active layer SC according to the present embodiment is formed including a first and third part SCa, SCc each extending in an y direction, and a second part SCb extending in a x direction. One end of the first part SCa is connected to a video signal line SL via a signal line contact C1. In addition, the other end of the first part SCa is located at a point exceeding a scanning line G seen from the one end. The second part SCb extends from the other end of the first part SCa in an x direction up to a center point vicinity between two adjacent video signal lines SL. The third part SCc extends from one end part located at a center point vicinity between two adjacent video signal lines SL among both ends of the second part SCb up to a section exceeding a scanning line G, and is connected there to a pixel electrode PE via a pixel contact C2.

A scanning line G extends in a straight line in an x direction and intersects an active layer SC at two center point vicinities, a first part SCa center point vicinity and a third part SCc center point vicinity. Therefore, a pixel transistor according to the present embodiment is a double gate type.

A main line TLa of a characteristic control line TL is arranged to cover a second part SCb of a series of active layers SC arranged in an x direction. On the other hand, a characteristic control electrode TLb which branches off from the main line TLa is arranged for each pixel and each video signal line SL in the present embodiment. The characteristic control electrode TLb corresponding to a pixel extends along a third part SCc of an active layer SC up to a section exceeding a fifth edge part E5. The characteristic control electrode TLb corresponding to a video signal line SL extends along a first part SCa of an active layer SC up to a section exceeding a fourth edge part E4. In the present embodiment, the third edge part E3 and sixth edge part E6 are not covered by a characteristic control electrode TLb.

Even with the display device 1 of the present embodiment, since the characteristic control electrode TLb which applies a voltage is arranged in a part which is not covered by a scanning line G in an active layer SC, it is possible to obtain the effect of a reduction in an OFF current of a pixel transistor by applying a characteristic control voltage to the characteristic control electrode TL the same as was explained in the first embodiment. Therefore, since it is possible to store a charge in advance in each pixel over a sufficiently long period of time even when a storage capacitor in each pixel is small, it is possible to obtain a liquid crystal display device which exhibits high display characteristics.

Furthermore, in the present embodiment, the third edge part E3 and sixth edge part E6 are not covered by a characteristic control electrode TLb as described above. This is a structure for suppressing as much as possible an increase in parasitic capacitance of a scanning line G by minimizing the intersection area between a scanning line G and characteristic control electrode TLb, and although the effect of a reduction in an OFF current of a pixel transistor is smaller compared to the case where the third edge part E3 and sixth edge part E6 are covered by a characteristic control electrode TLb, it is possible to obtain the effect of a reduction in an OFF current of a pixel transistor compared to a case when a characteristic control electrode TLb is not arranged at all. In addition, the control method of a characteristic control voltage shown in FIG. 14 can also be suitably applied to the present embodiment.

Seventh Embodiment

Figure 24A:
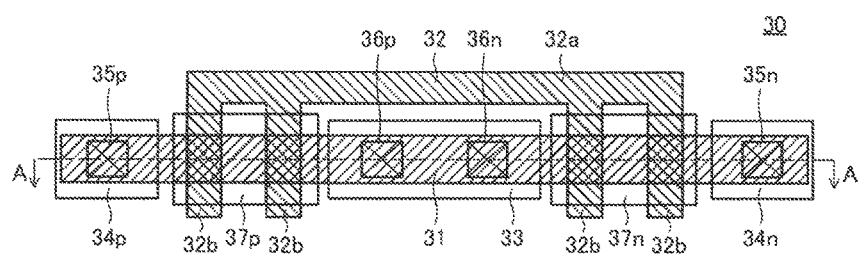
FIG. 24A is a schematic planar diagram of an inverter circuit 30 according to a seventh embodiment of the present invention.
Figure 24B:
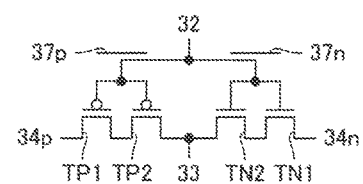
FIG. 24B is a circuit diagram of the inverter circuit 30.
Figure 24C:
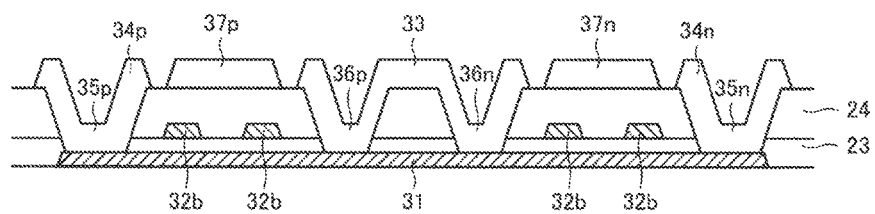
FIG. 24C is a cross-sectional diagram of the inverter circuit 30 corresponding to the line A-A shown in FIG. 24A.

FIG. 24A, FIG. 24B and FIG. 24C are diagrams showing an example of an inverter circuit 30 included in a drive circuit part (signal line selection switch 14, scanning line drive circuit 15 and the like shown in FIG. 1) in a display device 1 according to a seventh embodiment of the present invention. In the present embodiment, an example in which a transistor (drive transistor) forming the inverter circuit 30 is the object of characteristic control by the present invention is explained. Furthermore, the object of characteristic control by the present invention may be both or just one of a pixel transistor within a pixel part and a drive circuit part.

FIG. 24A is a schematic planar diagram of an inverter circuit 30, FIG. 24B is a circuit diagram of the inverter circuit 30, and FIG. 24C is a cross-sectional diagram of the inverter circuit 30 corresponding to the line A-A shown in FIG. 24A.

First, as is shown in FIG. 24B, the inverter circuit 30 is formed including two P channel type transistors TP1, TP2, and two N channel type transistors TN1, TN2. The transistors TP1, TP2, TN1, TN2 are formed above the same matrix array substrate 10 as the pixel transistor described above. The transistors TP1, TP2 are connected in series in this order between a source electrode 34p and drain electrode 33, and the transistors TN1, TN2 are connected in series in this order between a source electrode 34n and drain electrode 33. A gate electrode of the transistors TP1, TP2, TN1, TN2 is formed by a common gate electrode 32.

Next, referring to FIG. 24A and FIG. 24C, the inverter circuit 30 includes an active layer 31 formed in a straight line, the source electrode 34p is arranged at one end, the drain electrode 33 is arranged at the center and the source electrode 34n is arranged at the other end respectively. The drain electrode 34p is connected to the active layer 31 via a source contact 35p, the drain electrode 33 is connected to the active layer 31 via two drain contacts 36p, 36n, and the source electrode 34n is connected to the active layer 31 via a source contact 35n.

The gate electrode 32 is formed including a straight-line part 32a formed in parallel to the active layer 31, and four projection parts 32b which project from the straight-line part to the active layer 31 side. Each of the four projection parts 32b intersect with the active layer 31 respectively, and oppose the active layer 31 at the intersection part via the gate insulation film 23 as is shown in FIG. 24C. Two of the four projection parts 32b are arranged between the source electrode 34p and drain electrode 33, and each respectively form a gate electrode of the transistors TP1 and TP2 shown in FIG. 24B. In addition, the other two are arranged between the source electrode 34n and drain electrode 33, and each respectively form a gate electrode of the transistors TN1 and TN2 shown in FIG. 24B.

The inverter circuit 30 is further formed including two characteristic control electrodes 37p, 37n. As is shown in FIG. 24C, the characteristic control electrode 37p is arranged via the insulation film 24 above the two projection parts 32b which form a gate electrode of the transistors TP1, TP2, and the characteristic control electrode 37n is arranged via the insulation film 24 above the two projection parts 32b which form a gate electrode of the transistors TN1, TN2. The characteristic control electrodes 37p, 37n are each formed not only above two corresponding projections parts 32b, but also above and across an active layer 31 located between and on both sides of two corresponding projections parts 32b. Therefore, the characteristic control electrodes 37p, 37n cover an edge part of each projection part 32b in an intersection part between each projection part 32b and an active layer 31.

A voltage of 0V is fixedly supplied from a power supply circuit not shown in the diagram as a characteristic control voltage for controlling the characteristics of the transistors TP1, TP2, TN1, TN2 to the characteristic control electrodes 37p, 37n. Here, a characteristic control voltage (second control voltage) applied to a drive transistor in this way is set to a different value than a characteristic control voltage (first control voltage) applied to a pixel transistor. Therefore, a power supply circuit which generates and supplies a characteristic control voltage for a drive transistor is arranged separately from a power supply circuit which generates and supplies a characteristic control voltage for a pixel transistor.

As explained above, according to the inverter circuit 30 of the present embodiment, since characteristic control electrodes 37p, 37n which apply a voltage are arranged in a part not covered by a gate electrode 32 in the active layer 31, and a characteristic control voltage for controlling the transistors TP1, TP2, TN1, TN2 is applied to the characteristic control electrodes 37p, 37n, the transistors TP1, TP2, TN1, TN2 can block the effect of an unnecessary electrical field from the other two wires and maintain a balanced threshold value, thereby it is possible to prevent malfunction of a logic circuit, suppress a consumption current due to a flow-through current (AC current) and maintain operation speed balance of a logic circuit. In addition, in the case of a delay gate formed from a plurality of stages of inverters and which is input with an input signal and outputs a delay signal after a delay period, or in the case where a larger delay is preferable in terms of a timing margin of a circuit operation even in a signal stage inverter, since it is possible to increase a threshold value by supplying a positive power supply voltage Vgh (+8.5V) to a characteristic control electrode 37p and a negative power supply voltage Vgl (−6.5V) to a characteristic control electrode 37n, the delay period of an output signal becomes larger. In this way, since it is possible to create a large delay period with a small number of stages in the case of a delay gate, it is possible to reduce the size of a layout and it is easier to obtain a timing margin in a single stage inverter.

Eighth Embodiment

Figure 25A:
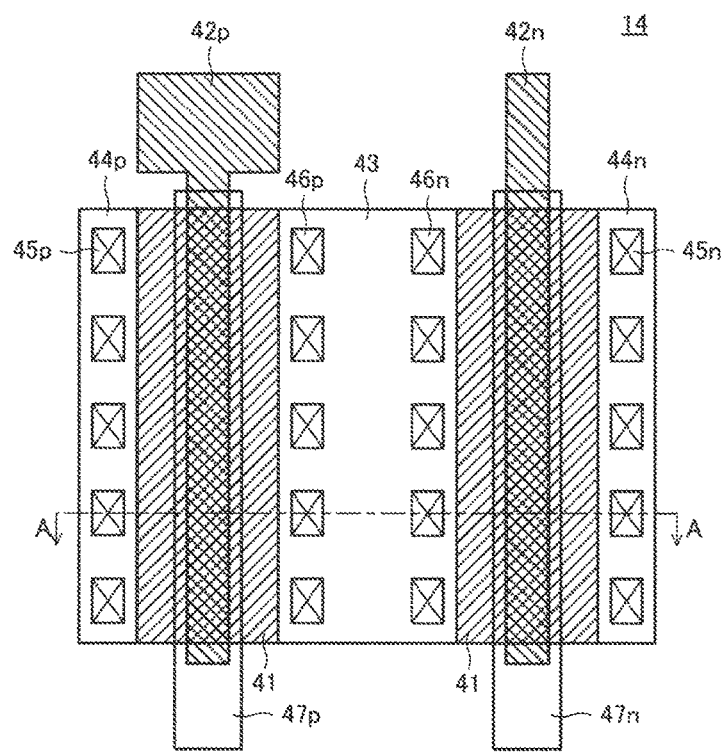
FIG. 25A is a schematic planar diagram of a signal line selection switch 14 according to an eighth embodiment of the present invention.
Figure 25B:
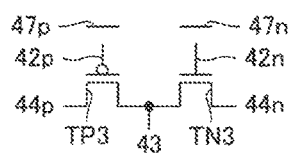
FIG. 25B is a circuit diagram of the signal line selection switch 14.
Figure 25C:
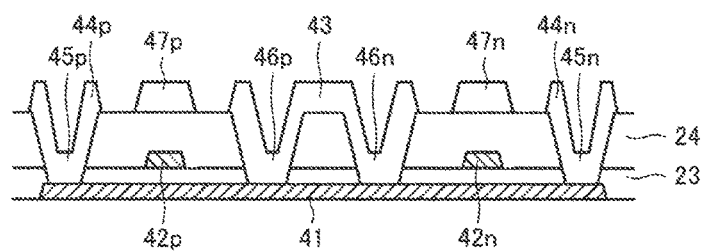
FIG. 25C is a cross-sectional diagram of the signal line selection switch 14 corresponding to the line A-A shown in FIG. 25A.

FIG. 25A, FIG. 25B and FIG. 25C are diagrams showing an example of a signal line selection switch 14 of the display device 1 according to an eighth embodiment of the present invention. In the present embodiment, an example in which a transistor (drive transistor) forming the signal line selection switch 14 is the object of characteristic control by the present invention is explained.

FIG. 25A is a schematic planar diagram of the signal line selection switch 14, FIG. 25B is a circuit diagram of the signal line selection switch 14, and FIG. 25C is a cross-sectional diagram of the signal line selection switch 14 corresponding to the line A-A shown in FIG. 25A.

First, as is shown in FIG. 25B, the signal line selection switch 14 is formed including one P channel type transistor TP3 and one N channel type transistor TN3. The transistors TP3, TPN are also formed above the same matrix array substrate 10 as the pixel transistor described above. The transistor TP3 is connected between a source electrode 44p and drain electrode 43, and the transistor TN3 is connected between a source electrode 44n and drain electrode 43. A gate electrode of the transistor TP3 is formed by a gate electrode 42p, and a gate electrode of the transistor TN3 is formed by a gate electrode 42n.

Next, referring to FIG. 25A and FIG. 25C, the signal line selection switch 14 includes an active layer 41 formed in a rectangular shape, the source electrode 44p is arranged at one end in a length direction, the drain electrode 43 is arranged at the center in a length direction, and the source electrode 44 is arranged at the other end in a length direction respectively. The source electrode 44p is connected to an active layer 41 by a plurality of source contacts 45p, the drain electrode 43 is connected to an active layer 41 by a plurality of drain contacts 46p, 46n respectively, and the source electrode 44n is connected to an active layer 41 by a plurality of source contacts 45n.

The gate electrodes 42p, 42n each extend in a direction perpendicular to a length direction of an active layer 41 respectively, and intersect with the active layer 41 across the entire width of the active layer 41. The gate electrodes 42p, 42n and the active layer 41 mutually oppose each other via a gate insulation film 23 in the intersection part as is shown in FIG. 25C.

The signal line selection switch 14 is further formed including two characteristic control electrodes 47p, 47n. As is shown in FIG. 25C, the characteristic control electrode 47p is arranged above the gate electrode 42p via an insulation film 24, and the characteristic control electrode 47n is arranged above the gate electrode 42n via an insulation film 24. The characteristic control electrode 47p is formed thicker than the gate electrode 42p, and an entire intersection part between the gate electrode 42p and an active layer 41 covers an entire edge part of the gate electrode 42p in the intersection part and covers the active layer 41 on both sides of the intersection part. Similarly, the characteristic control electrode 47n is formed thicker than the gate electrode 42n, and an entire intersection part between the gate electrode 42n and an active layer 41 covers an entire edge part of the gate electrode 42n in the intersection part and covers the active layer 41 on both sides of the intersection part.

The signal line selection switch 14 is arranged for each video signal line SL shown in FIG. 2 for example, and the drain electrode 43 is connected to a corresponding video signal line SL. In addition, a video signal is input from a drive IC12 shown in FIG. 1 to the source electrodes 44p, 44n. Furthermore, an inversion signal of a signal line selection signal is input from the drive IC12 to the gate electrode 42p, and a signal line selection signal is input from the drive IC12 to the gate electrode 42n.

A negative power supply voltage Vgl (−6.5V) is fixedly supplied from a power supply circuit not shown in the diagram as a characteristic control voltage for controlling the characteristics of the transistor TP3 to the characteristic control electrode 47p. On the other hand, a positive power supply voltage Vgh (+8.5V) is fixedly supplied from a power supply circuit not shown in the diagram as a characteristic control voltage for controlling the characteristics of the transistor TN3 to the characteristic control electrode 47n.

As explained above, according to the signal line selection switch 14 of the present embodiment, since characteristic control electrodes 47p, 47n which apply a voltage are arranged in a part not covered by gate electrodes 42p, 42n in the active layer 41, and a characteristic control voltage for controlling the transistors TP3, TN3 is applied to the characteristic control electrodes 47p, 47n, it is possible to increase a threshold value of the transistors TP3, TN3 and improve charging characteristics. Although the signal line selection switch holding writing of a video signal, by setting a characteristic control voltage to be supplied to an N channel type transistor to 0V or more, and a characteristic control voltage to be supplied to a P channel type transistor to 0V or less, it is possible to set a low threshold value, improve charging characteristics, reduce an OFF current and improve holding characteristics.

Ninth Embodiment

Figure 26:
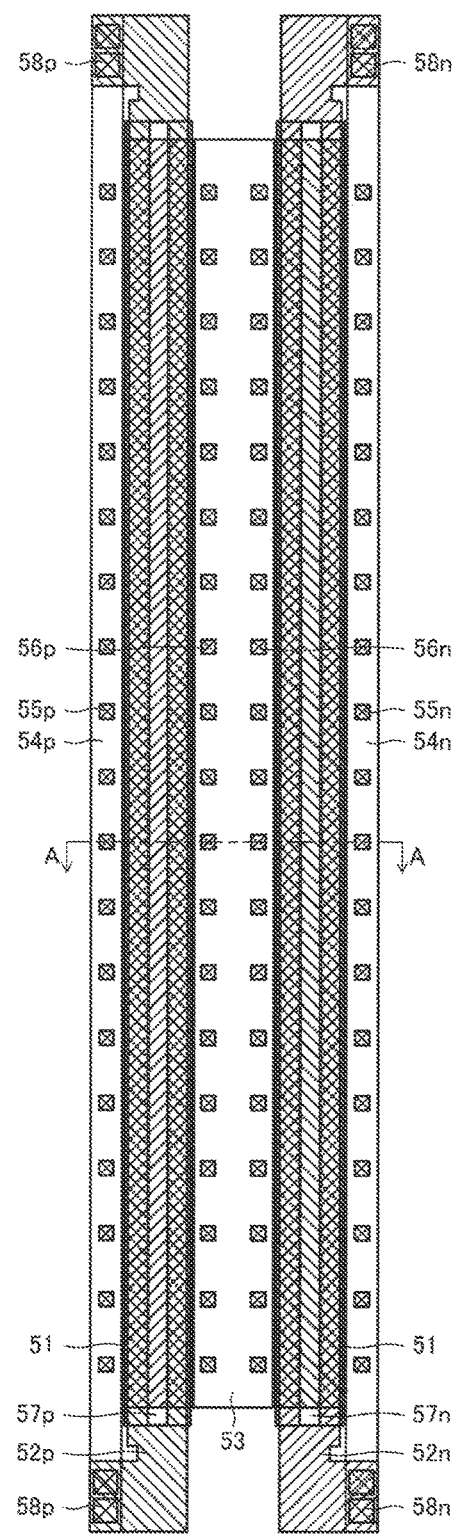
FIG. 26 is a schematic planar diagram of a protection diode 13 according to a ninth embodiment of the present invention.
Figure 27A:
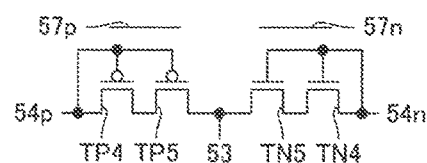
FIG. 27A is a circuit diagram of the protection diode 13 shown in FIG. 26.
Figure 27B:
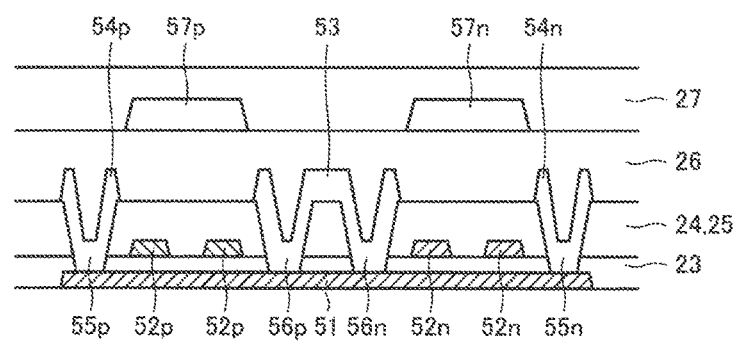
FIG. 27B is a cross-sectional diagram of the protection diode 13 corresponding to the line A-A shown in FIG. 26.

FIG. 26, FIG. 27A and FIG. 27B are diagrams showing an example of a protection diode 13 (see FIG. 1) in the display device 1 according to a ninth embodiment of the present invention. In the present embodiment, an example in which a transistor (drive transistor) forming a protection diode 13 is the object of characteristic control by the present invention is explained. Furthermore, although the protection diode 13 is adopted here, the present invention can similarly be applied to a drive transistor which forms a protection diode 17.

FIG. 26 is a schematic planar diagram of a protection diode 13, FIG. 27A is a circuit diagram of the protection diode 13 shown in FIG. 26, and FIG. 27B is a cross-sectional diagram of the protection diode 13 corresponding to the line A-A shown in FIG. 26.

First, as is shown in FIG. 27A, the protection diode 13 is formed including two P channel type transistors TP4, TP5, and two N channel type transistors TN4, TN5. The transistors TP4, TP5, TN4, TN5 are formed above the same matrix array substrate 10 as the pixel transistor described above. The transistors TP4, TP5 are connected in series in this order between a source electrode 54p and drain electrode 53, and the transistors TN4, TN5 are connected in series in this order between a source electrode 54n and drain electrode 53. A gate electrode of the transistors TP4, TP5 is connected to the source electrode 54p, therefore the transistors TP4, TP5 are diode connected. Similarly, a gate electrode of the transistors TN4, TN5 is connected to the source electrode 54n, therefore the transistors TN4, TN5 are diode connected.

Next, referring to FIG. 26 and FIG. 27B, the protection diode 13 includes an active layer 51 formed in a rectangular shape, the source electrode 54p is arranged at one end in a width direction, the drain electrode 53 is arranged at the center in a width direction, and the source electrode 54n is arranged at the other end in a width direction respectively. The source electrode 54p is connected to an active layer 51 by a plurality of source contacts 55p, the drain electrode 53 is connected to an active layer 51 by a plurality of drain contacts 56p, 56n respectively, and the source electrode 54n is connected to an active layer 51 by a plurality of source contacts 55n.

The gate electrodes 52p, 52n are divided into two and each extend in a direction perpendicular to a length direction of an active layer 51 respectively, and both intersect with the active layer 51 across the entire length in a length direction. The gate electrodes 52p, 52n and the active layer 51 mutually oppose each other via a gate insulation film 23 in the intersection part as is shown in FIG. 27B. The gate electrode 52p is connected to the source electrode 54p via a gate contact 58p at both ends in a length direction. In addition, the gate electrode 52n is connected to the source electrode 54n via a gate contact 58n at both ends in a length direction.

The protection diode 13 is further formed including two characteristic control electrodes 57p, 57n. As is shown in FIG. 27B, the characteristic control electrode 57p is formed above an insulation film 26, that is, is formed in the same layer as a common electrode CE shown in FIG. 3 and the like, the characteristic control electrode 57p is arranged above two gate electrodes 52p, and the characteristic control electrode 57n is arranged above two gate electrodes 52n via insulation films 24, 25 respectively. The characteristic control electrode 57p is formed not only above two gate electrodes 52p, but also above an active layer 51 located therebetween and on both sides. Therefore, the characteristic control electrode 57p covers an edge part in each gate electrode 52p at an intersection part between the two gate electrodes 52p and an active layer 51. Similarly, the characteristic control electrode 57n is formed not only above two gate electrodes 52n, but also above an active layer 51 located therebetween and on both sides. Therefore, the characteristic control electrode 57n covers an edge part in each gate electrode 52n at an intersection part between the two gate electrodes 52n and an active layer 51.

The drain electrode 53 is connected to a terminal (not shown in the diagrams) which is the object of protection. In addition, a positive power supply voltage Vgh (+8.5V) is fixedly supplied from a power supply circuit not shown in the diagram to the source electrode 54p, and a negative power supply voltage Vgl (−6.5V) is fixedly supplied from a power supply circuit not shown in the diagram to the source electrode 54n. A positive power supply voltage Vgh (+8.5V) is fixedly supplied from a power supply circuit not shown in the diagram as a characteristic control voltage for controlling the characteristics of the transistors TP4, TP5 to the characteristic control electrode 57p, and a negative power supply voltage Vgl (−6.5V) is fixedly supplied from a power supply circuit not shown in the diagram as a characteristic control voltage for controlling the characteristics of the transistors TN4, TN5 to the characteristic control electrode 57n. In this way, it is preferred that a characteristic control voltage of a protection diode formed by diode connecting a P channel type transistor is 0V or more, and it is preferred that a characteristic control voltage of a protection diode formed by diode connecting an N channel type transistor is 0V or less.

As explained above, according to protection diode 13 of the present embodiment, since characteristic control electrodes 57p, 57n which apply a voltage are arranged in a part not covered by gate electrodes 52p, 52n in the active layer 51, and a characteristic control voltage for controlling the transistors TP4, TP5, TN4, TN5 is applied to the characteristic control electrodes 57p, 57n, it is possible to reduce an OFF current by Vgs=0V by setting a high threshold value of the transistors TP4, TP5, TN4, TN5.

Furthermore, by combining the seventh to ninth embodiments, it is possible to set a low threshold voltage of a transistor which forms the signal line selection switch 14 compared to the inverter circuit 30 or protection diodes 13, 17. In addition, it is also possible to realize stable operation of a logic circuit, low power consumption and preferred charging characteristics and holding characteristics of the signal line selection switch 14.

Tenth Embodiment

Figure 28:
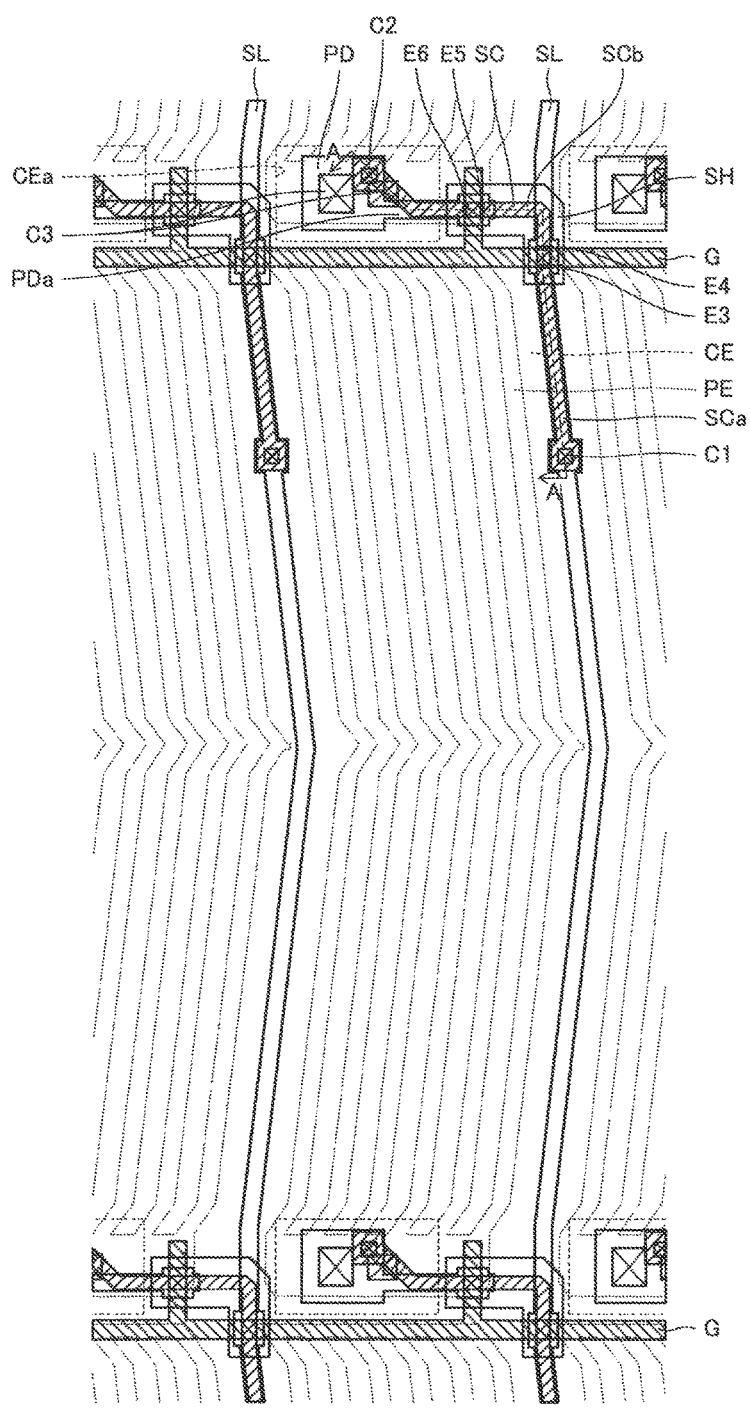
FIG. 28 is a diagram showing in detail a planar structure of a part of a pixel region 16 of a display device 1 according to a tenth embodiment of the present invention.
Figure 29:
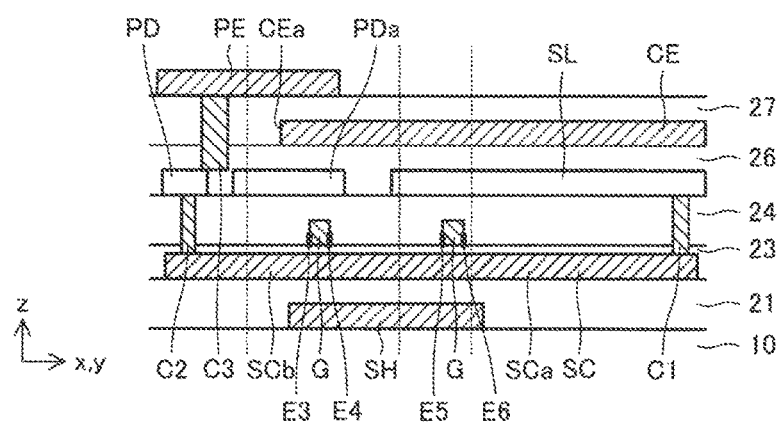
FIG. 29 is a schematic cross-sectional diagram of a display device 1 corresponding to the line A-A shown in FIG. 28.

FIG. 28 is a diagram showing in detail a planar structure of a part of a pixel region 16 of a display device 1 according to a tenth embodiment of the present invention. In addition, FIG. 29 is a schematic cross-sectional diagram of a display device 1 corresponding to the line A-A shown in FIG. 28. The display device 1 according to the present embodiment is different to the display device 1 according to the first embodiment in that a characteristic control electrode PDA extending from a video signal line SL and contact base PD is used instead of the main line TLa and characteristic control electrode TLb of the dedicated characteristic control electrode TL. The same reference symbols are attached to the same structure as the first embodiment and the points different from those in the first embodiment are focused on and explained below.

Although a video signal line SL according to the present embodiment includes a part which curves in a region between adjacent pixels in a y direction, as a whole the video signal line SL extends in a y direction the same as the first embodiment.

An active layer SC is formed including a first part SCa extending along a video signal line SL, and a second part SCb which makes up the remainder. One end of the first part SCa is connected to the video signal line SL via a video signal contact C1 in a part which extends inclined from a y direction in the video signal line SL. In addition, the other end of the first part SCa is located in a vicinity slightly exceeding a scanning line G seen from the one end of the first part SCa. One end of the second part SCb is connected to the other end of the first part SCa, and the other end is connected to a pixel contact C2 in a center vicinity of two adjacent video signal lines SL. The pixel contact C2 is connected to a bottom end of a pixel contact C3 via a contact base PD arranged on the same layer as a video signal line SL, and an upper end of the pixel contact C3 is connected to a pixel electrode PE.

A scanning line G is formed including a branch line extending in a y direction for each pixel. The branch line intersects with an active layer SC close to the center of the second part SCb. On the other hand, a main line of a scanning line G intersects with an active layer SC close to the center of the first part SCa. Therefore, a pixel transistor according to the present embodiment is a double gate type.

A video signal line SL is located above the first part SCa and a width thereof is formed wider than the width of the first part SCa. Therefore, an intersection part of a main line of a scanning line G and an active layer SC is completely covered by a video signal line SL, and the third edge part E3 and fourth edge part E4 defined in the first embodiment are also completely covered by a video signal line SL.

On the other hand, an intersection part of a branch line of a scanning line G and an active layer SC is covered by a characteristic control electrode PDa extending from a contact base PD. The characteristic control electrode PDa is a wire extending from the contact base PD passing above the second part SCb to a vicinity exceeding a branch line of a scanning line G. The width of the characteristic control electrode PDa is formed wider than a width of the second part SCb. Therefore, an intersection part of a branch line of a scanning line G and an active layer SC is completely covered by the characteristic control electrode PDa, and the fifth edge part E5 and sixth edge part E6 defined in the first embodiment are also completely covered by the characteristic control electrode PDa.

A light blocking layer SH is formed so that both an intersection part of a main line of a scanning line G and an active layer SC and an intersection part of a branch line of a scanning line G and an active layer SC are completely hidden when the matrix array substrate 10 is viewed from below. This is a structure for ensuring that a light leak current generated in each intersection part does not becomes unbalanced.

According to the display device 1 of the present embodiment, it is possible to make a voltage applied to an active layer SC and the strength of an electrical field thereof the same by a video signal line SL and characteristic control electrode PDa when viewed by an entire double gate type pixel transistor in a frame in which a pixel electrode PE stores a signal with a positive polarity and a frame in which a pixel electrode PE stores a signal with a negative polarity. Although the amount of reduction of an OFF current of a pixel transistor is smaller when compared to supplying a characteristic control voltage using a dedicated characteristic control electrode TLb as in the first to ninth embodiments, since it is possible to set the amount of an OFF current between a positive polarity storage frame and a negative polarity storage frame to near values, it is possible to suppress flickering (difference in luminosity between storage frames) and reduce burning.

Furthermore, in the present embodiment, it is preferred to set the width of a video signal line SL above a third edge part E3 and the width of a characteristic control electrode PDa above a sixth edge part E6 to the same values, and it is preferred to set the width of a video signal line SL above a fourth edge part E4 and the width of a characteristic control electrode PDa above a fifth edge part E5 to the same values. In this way, it is possible to align the strength of an electrical field provided by a video signal line SL to an active layer SC and the strength of an electrical field provided by a characteristic control electrode PDa to an active layer SC. In addition, it is preferable to arrange the distance (covering length) from the fifth edge portion E5 to the end of the characteristic control electrode PDa so as to be closer to the covering length of the video signal line SL from the fourth edge portion E4.

In addition, as is shown in FIG. 28, it is preferred that the width of a video signal line SL in particular is thicker in a region directly above an intersection part of a main line of a scanning line G and an active layer SC, and it is preferred that the width of a characteristic control electrode PDa in particular is thicker in a region directly above an intersection part of a branch line of a scanning line G and an active layer SC. In this way, it is possible to prevent an electrical field from an upper layer common electrode CE from reaching an active layer SC. In addition, it is preferred to set the length of a wider part of a video signal line SL above an intersection part of a main line of a scanning line G and an active layer SC and the length of a wider part of a characteristic control electrode PDa above an intersection part of a branch line of a scanning line G and an active layer SC to the same values.

Eleventh Embodiment

Figure 30:
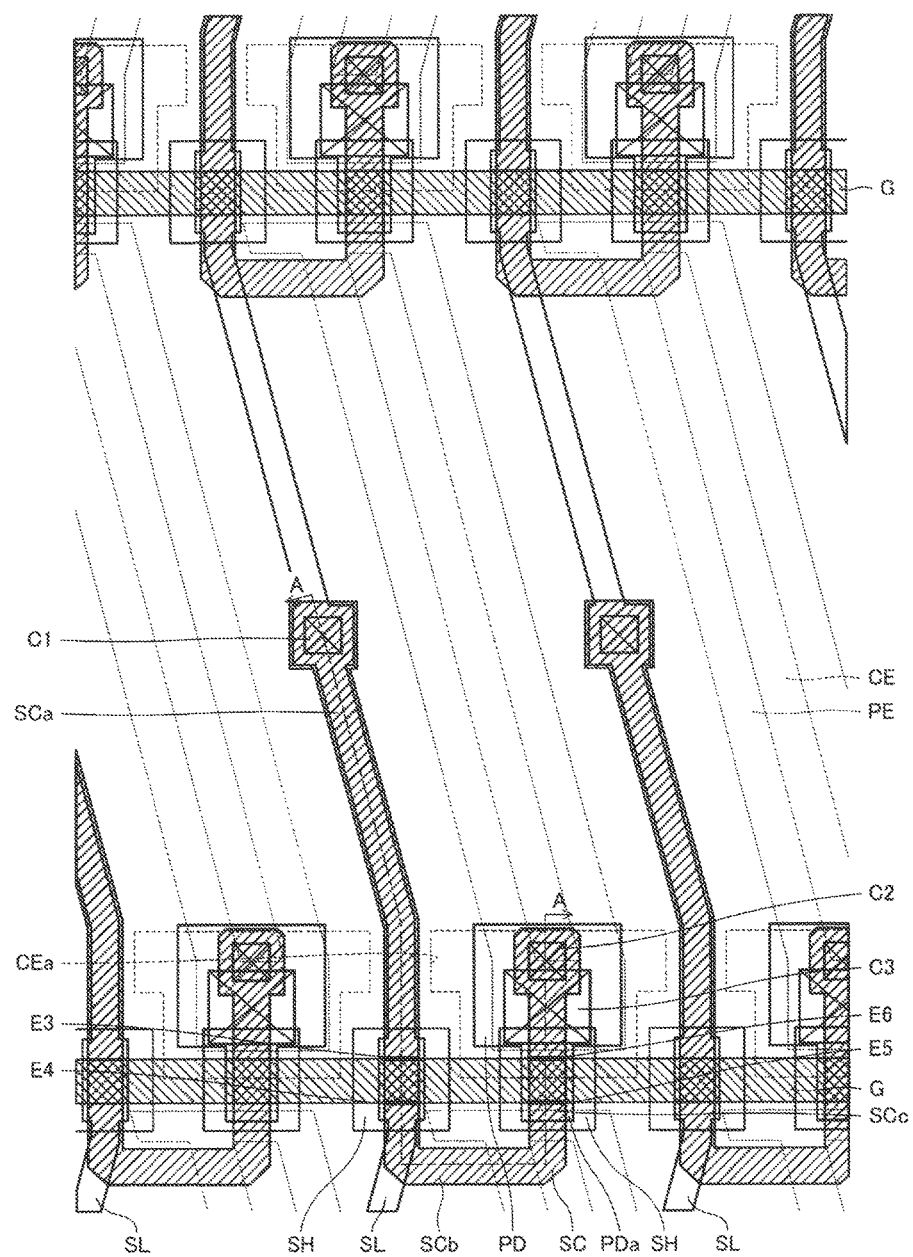
FIG. 30 is a diagram showing in detail a planar structure of a part of a pixel region 16 of a display device 1 according to an eleventh embodiment of the present invention.
Figure 31:
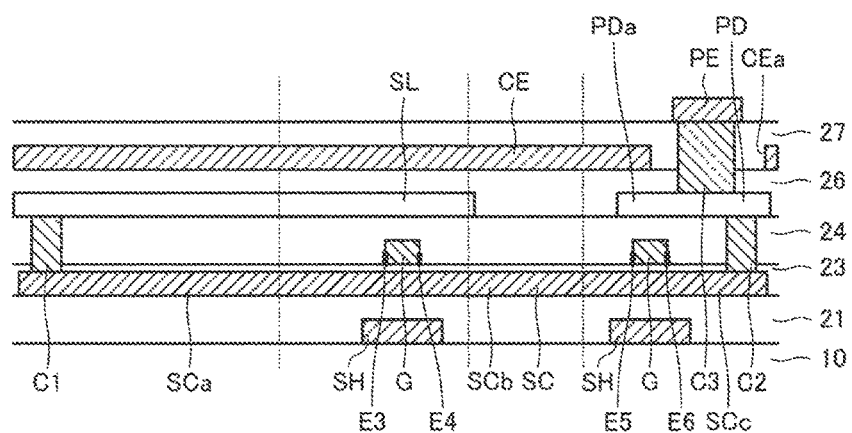
FIG. 31 is a schematic cross-sectional diagram of a display device 1 corresponding to the line A-A shown in FIG. 30.

FIG. 30 is a diagram showing in detail a planar structure of a part of a pixel region 16 of the display device 1 according to an eleventh embodiment of the present invention. In addition, FIG. 31 is a schematic cross-sectional diagram of a display device 1 corresponding to the line A-A shown in FIG. 30. The display device 1 according to the present embodiment is different to the display device 1 according to the tenth embodiment in the shape of an active layer SC. The same reference symbols are attached to the same structure as the tenth embodiment and the points different from those in the tenth embodiment are focused on and explained below.

A video signal line SL according to the present embodiment is formed by a serpentine shaped wire extending as a whole in a y direction the same as in the third embodiment.

An active layer SC has a planar shape similar to a mirror character of the letter "J", specifically, an active layer SC is formed including a first part SCa extending along a video signal line SL, a second part SCb extending in an x direction, and a third part SCc extending in a y direction. One end of the first part SCa is connected to a video signal line SL via a signal line contact C1 in a part extending inclined from a y direction in a video signal line SL. In addition, the other end of the first part SCa is located in a vicinity slightly exceeding a scanning line G seen from the one end of the first part SCa. One end of the second part SCb is connected to the other end of the first part SCa, and the other end is located at a center vicinity of two adjacent video signal lines SL. One end of the third part SCc is connected to the other end of the second part SCb, and the other end is connected to a pixel electrode PE via a pixel contact C2 and the like in the vicinity slightly exceeding a scanning line G seen from the one end of the third part SCc.

A scanning line G intersects an active layer SC in the first part SCa and third part SCc. Therefore, a pixel transistor according to the present embodiment is a double gate type.

A video signal line SL is located above the first part SCa and a width thereof is formed wider than the width of the first part SCa. Therefore, an intersection part of a scanning line G and the first part SCa of an active layer SC is completely covered by a video signal line SL, and the third edge part E3 and fourth edge part E4 defined in the first embodiment are also completely covered by a video signal line SL.

On the other hand, an intersection part of a scanning line G and the third part SCc of an active layer SC is covered by a characteristic control electrode PDa extending from a contact base PD. The characteristic control electrode PDa according to the present embodiment is a wire extending from the contact base PD passing above the third part SCc to a vicinity exceeding a scanning line G. The width of the characteristic control electrode PDa is formed wider than a width of the third part SCc. Therefore, an intersection part of a scanning line G and the third part SCc of an active layer SC is completely covered by the characteristic control electrode PDa, and the fifth edge part E5 and sixth edge part E6 defined in the first embodiment are also completely covered by the characteristic control electrode PDa.

According to the display device 1 of the present embodiment, it is possible to suppress flickering and reduce burning for the same reasons as in the tenth embodiment.

Furthermore, in the present embodiment, it is preferred to align the strength of an electrical field provided by a video signal line SL to an active layer SC and the strength of an electrical field provided by a characteristic control electrode PDa to an active layer SC by setting the width of a video signal line SL above a third edge part E3 and the width of a characteristic control electrode PDa above a sixth edge part E6 to the same value, and setting the width of a video signal line SL above a fourth edge part E4 and the width of a characteristic control electrode PDa above a fifth edge part E5 to the same value. In addition, it is preferable to dispose the distance (that is, covering length) from the fifth edge portion E5 to the end of the characteristic control electrode PDa so as to be closer to the covering length of the video signal line SL from the fourth edge portion E 4.

Twelfth Embodiment

Figure 32:
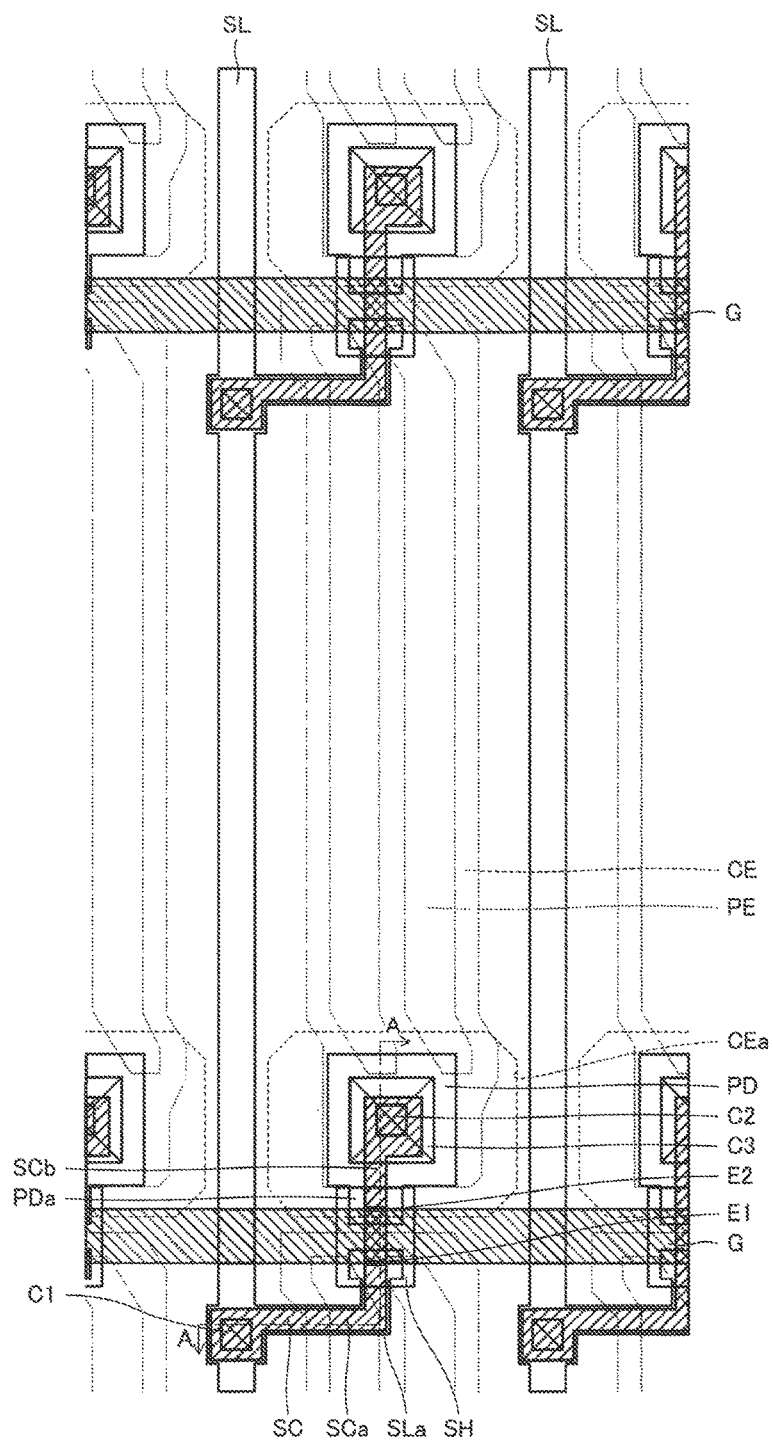
FIG. 32 is a diagram showing in detail a planar structure of a part of a pixel region 16 of a display device 1 according to a twelfth embodiment of the present invention.
Figure 33:
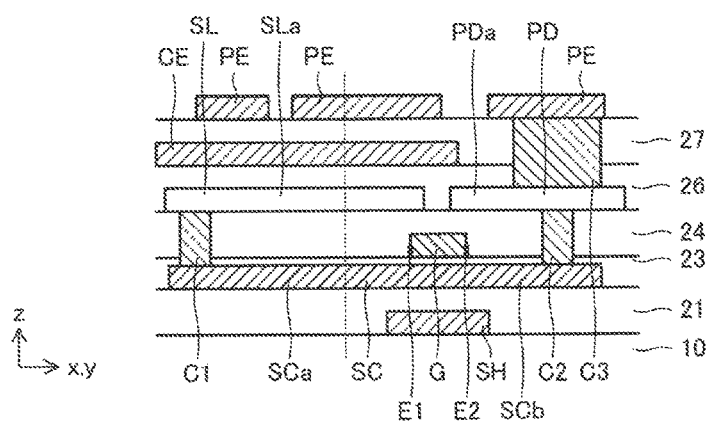
FIG. 33 is a schematic cross-sectional diagram of a display device 1 corresponding to the line A-A shown in FIG. 32.

FIG. 32 is a diagram showing in detail a planar structure of a part of a pixel region 16 of the display device 1 according to a twelfth embodiment of the present invention. In addition, FIG. 33 is a schematic cross-sectional diagram of a display device 1 corresponding to the line A-A shown in FIG. 32. The display device 1 according to the present embodiment is different to the display device 1 according to the tenth embodiment in that a pixel transistor is a single gate type. The same reference symbols are attached to the same structure as the tenth embodiment and the points different from those in the tenth embodiment are focused on and explained below.

A video signal line SL according to the present embodiment is formed by a straight line shaped wire extending in a y direction the same as in the first embodiment.

An active layer SC has a planar shape similar to a mirror character of the letter "L", specifically, an active layer SC is formed including a first part SCa extending in an x direction, and a second part SCb extending in a y direction. One end of the first part SCa is connected to a video signal line SL via a signal line contact C1. In addition, the other end of the first part SCa is located at a center vicinity of two adjacent video signal lines SL. One end of the second part SCb is connected to the other end of the first part SCa, and the other end is connected to a pixel electrode PE via a pixel contact C2 and the like in the vicinity slightly exceeding a scanning line G seen from the one end of the second part SCb.

A scanning line G intersects an active layer SC only close to the center of the second part SCb. Therefore, a pixel transistor according to the present embodiment is a single gate type.

In the intersection parts of a scanning line G and an active layer SC, a first edge part E1 defined in the third embodiment and a part in a vicinity thereof are covered by a characteristic control electrode SLa extending from a video signal line SL. The characteristic control electrode SLa is a wire extending from a connection position with a signal line contact C1 up to a vicinity exceeding a first edge part E1 along an active layer SC as is shown in FIG. 32. The width of the characteristic control electrode SLa is formed wider than the width of an active layer SC. Therefore, a part up to the signal line contact C1 from a vicinity of the first edge part E1 in an active layer SC is completely covered by the characteristic control electrode SLa.

On the other hand, in the intersection parts of a scanning line G and an active layer SC, a second edge part E2 defined in the third embodiment and a part in a vicinity thereof are covered by a characteristic control electrode PDa extending from a contact base PD. The characteristic control electrode PDa is a wire extending from the contact base PD up to a vicinity exceeding a second edge part E2 along an active layer SC as is shown in FIG. 32. The width of the characteristic control electrode PDa is formed wider than the width of an active layer SC. Therefore, a part up to a pixel contact C2 from a vicinity of the second edge part E2 in an active layer SC is completely covered by the characteristic control electrode PDa.

According to the display device 1 of the present embodiment, it is possible to suppress flickering (difference in luminosity between storage frames) and reduce burning for the same reasons as in the tenth embodiment. It is also possible to some extent to obtain a reduction effect of an OFF current of a pixel transistor.

Furthermore, in the present embodiment, it is preferred to set the width of a characteristic control electrode SLa above a first edge part E1 and the width of a characteristic control electrode PDa above a second edge part E2 to the same value. In this way, it is possible to align the strength of an electrical field provided by a characteristic control electrode SLa to an active layer SC and the strength of an electrical field provided by a characteristic control electrode PDa to an active layer SC. In addition, it is preferable to dispose the distance (that is, covering length) from the first edge portion E1 to the end of the characteristic control electrode SLa so as to be closer to the covering length of the characteristic control electrode PDa from the second edge portion E2.

Figure 34:
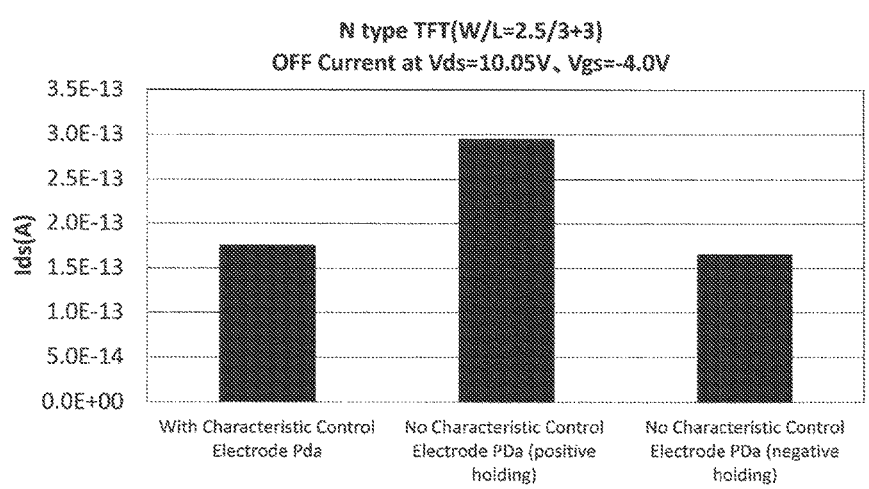
FIG. 34 is a diagram showing a change in an amount of OFF current in the case where transistors on both sides of an N channel type double gate transistor are covered by a characteristic control electrode, and in the case where a characteristic control electrode voltage is a source voltage and in the case where a characteristic control electrode voltage is a drain voltage in the case where a transistor on only one side is covered by a characteristic control electrode respectively.

FIG. 34 shows the results of measuring the effects of the tenth and eleventh embodiments shown in FIG. 28 to FIG. 31. FIG. 34 is a diagram showing a change in an amount of OFF current in the case where transistors on both sides of an N channel type double gate transistor are covered by a different characteristic control electrode with the same width and length, and the case where only a transistor on one side is covered by a characteristic control electrode, and the case where only a transistor on one side is covered by a characteristic control electrode in the case where a characteristic control electrode voltage is a source voltage, and in the case where a characteristic control electrode voltage is a drain voltage. The experiment results shown in FIG. 34 were carried out using the pattern in FIG. 10B. 0V was applied to CS and 10.05V was applied to CD in FIG. 10B. As the voltage conditions imitating the tenth and eleventh embodiments shown in FIG. 28, FIG. 29, FIG. 30 and FIG. 31, the same 0V as CS was applied to a characteristic control electrode TLb arranged above SC1, and the same 10.05V as CD was applied to a characteristic control electrode TLb arranged above SC2 (item, stating that characteristic control electrode PDa is present in FIG. 34).

In comparison with this, voltage conditions were set imitating a state in which a pixel electrode stores a positive polarity voltage in the case where the characteristic control electrode PDa in FIG. 28 to FIG. 31 is not present, one transistor of a pixel double gate transistor is covered by a signal line and an electrode does not cover the other transistor, the same 0V as CS was applied to a characteristic control electrode TLb arranged above SC1, and a characteristic control electrode TLb arranged above SC2 was set to a floating state (item stating that characteristic control electrode PDa is not present (positive storage) in FIG. 34).

Voltage conditions were set imitating a state in which a pixel electrode stores a negative polarity voltage in the case where the characteristic control electrode PDa in FIG. 28 to FIG. 31 is not present, one transistor of a pixel double gate transistor is covered by a signal line and an electrode does not cover the other transistor, a characteristic control electrode TLb arranged above SC1 was set to a floating state and the same 10.05V as CD was applied to a characteristic control electrode TLb arranged above SCS (item stating that characteristic control electrode PDa is not present (negative storage) in FIG. 34). The W/L ratio of the N channel type transistor shown in FIG. 10B was assumed to be 2.5/3+3 and a gate voltage was −04V. In addition, a sample of a characteristic control electrode TLb with a width W in an x direction of 5.5 um was used. Measurement was carried out in a dark state in which light was not incident on the transistor.

As can be understood from FIG. 34, an amount of OFF current of an N channel type transistor was larger when the voltage conditions imitating a state in which a pixel electrode stores a positive polarity voltage in the case where the tenth and eleventh examples are not used (characteristic control electrode PDa is not present) than the voltage conditions imitating a state in which a pixel electrode stores a negative polarity voltage in the case where the tenth and eleventh examples are not used. This difference in an amount of OFF current appears as flickering. In the case where the tenth and eleventh examples are used, an amount of OFF current is suppressed to an amount close to a negative polarity voltage stored by a pixel electrode in the case where the tenth and eleventh examples are not used. In addition, if the size of a characteristic control electrode covering SC1 and SC2 is the same, an amount of OFF current does not change even when the polarity of a storage voltage of a pixel electrode is inverted. In this way, it is possible to suppress the generation of flickering.

What is claimed is:

1. A display device comprising:
   a pixel part including
   a plurality of pixel electrodes arranged in a row direction and column direction, a plurality of pixel transistors arranged corresponding to the plurality of pixel electrodes, a scanning signal line arranged on each row and providing a scanning signal to a gate of each of the plurality of pixel transistors belonging to the same row, and a video signal line arranged on each column and providing a video signal to a source or drain of each of the plurality of pixel transistors belonging to the same column; and
   a drive circuit part including one or more drive transistors and outputting a signal to one of both of the scanning signal line arranged on each row and the video signal line arranged on each column;
   wherein
   each of the plurality of pixel transistors and the one or more drive transistors arranged above the same substrate and including an active layer and a gate electrode overlapping a part of the active layer via a gate insulation film;
   at least one of the plurality of pixel transistors and the one or more drive transistors is arranged with a characteristic control electrode applying a control voltage via an insulation film to a region other than regions overlapping the active layer and the gate electrode, and
   at least one of the plurality of pixel transistors and the one or more drive transistors is arranged with the active layer, the gate insulation film and the gate electrode in this order from the substrate side, and the characteristic control electrode is arranged via the insulation film on an opposite side of the gate electrode and the gate insulation film.

2. The display device according to claim 1, wherein the characteristic control electrode is arranged with respect to at least one of the plurality of pixel transistors.

3. The display device according to claim 2, wherein a width of the characteristic control electrode is different between a part opposing a first pixel transistor among the plurality of pixel transistors, and a part opposing a second pixel transistor among the plurality of pixel transistors in a position different in a row direction from the first pixel transistor.

4. The display device according to claim 1, wherein the characteristic control electrode is arranged with respect to the one or more drive transistors.

5. The display device according to claim 1, wherein at least one of the plurality of pixel transistors and the one or more drive transistors is an N type transistor, and a value of the control voltage applied to the characteristic control electrode is 0V or more.

6. The display device according to claim 1, wherein at least one of the plurality of pixel transistors and the one or more drive transistors is a P type transistor, and a value of the control voltage applied to the characteristic control electrode is 0V or more.

7. The display device according to claim 1, wherein each of the plurality of pixel transistors and the one or more drive transistors is arranged with a characteristic control electrode, the characteristic control electrode applies the control voltage to an edge part on the source electrode side and drain electrode side of the active layer of the plurality of pixel transistors.

8. The display device according to claim 1, wherein the characteristic control electrode is a transparent conductive film or a metal film having light blocking properties.

9. The display device according to claim 1, wherein the control voltage includes a first control voltage applied to the plurality of pixel transistors, and a second control voltage applied to the one or more drive transistors, and a value of the first control voltage and a value of the second control voltage are mutually different.

10. The display device according to claim 1, wherein a value of the control voltage is different depending on whether a corresponding at least one of the plurality of pixel transistors or the one or more drive transistors is ON or OFF.

* * * * *